United States Patent
Lim et al.

(10) Patent No.: US 7,830,179 B2
(45) Date of Patent: Nov. 9, 2010

(54) MULTI-FUNCTIONAL LOGIC GATE DEVICE AND PROGRAMMABLE INTEGRATED CIRCUIT DEVICE USING THE SAME

(75) Inventors: Sang-soon Lim, Chungcheongnam-do (KR); Chan-kyung Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/276,819

(22) Filed: Nov. 24, 2008

(65) Prior Publication Data

US 2009/0134908 A1 May 28, 2009

(30) Foreign Application Priority Data

Nov. 22, 2007 (KR) .................. 10-2007-0119624
Jul. 29, 2008 (KR) .................. 10-2008-0074089

(51) Int. Cl.
H03K 19/20 (2006.01)
(52) U.S. Cl. .................. 326/104; 326/112; 326/119; 326/121
(58) Field of Classification Search .................. None
See application file for complete search history.

(56) References Cited

U.S. PATENT DOCUMENTS 5,568,067 A * 10/1996 McDermott et al. ........... 326/55
7,262,635 B2 * 8/2007 Schleicher et al. ............ 326/41
7,279,936 B2 * 10/2007 Gliese et al. ................ 326/104

FOREIGN PATENT DOCUMENTS

| JP | 05-291941 | 11/1993 |
| JP | 06-252740 | 8/1994 |
| KR | 94-8264 | 4/1994 |
| KR | 1994-0702664 | 8/1994 |
| WO | WO 93/05577 | 3/1993 |

* cited by examiner

Primary Examiner—Anh Q Tran
(74) Attorney, Agent, or Firm—Myers Bigel Sibley & Sajovec

(57) ABSTRACT

Provided is a logic gate device capable of performing multiple logic operations by using a single logic gate circuit. The multi-functional logic gate device includes a pull-up switching unit having input switches of a first group being respectively connected to multiple input terminals and selection switches of the first group connected to either a selection terminal or a logically inverted selection terminal, the pull-up switching unit electrically connecting the input switches of the first group in series or in parallel between a power source and an output terminal according to logic levels of the selection terminal and the inverted selection terminal. The multi-function logic gate includes a pull-down switching unit having input switches of a second group being respectively connected to multiple input terminals and selection switches of the second group connected to either the selection terminal or the inverted selection terminal, the pull-down switching unit electrically connecting the input switches of the second group in parallel or in series between the output terminal and a ground terminal according to the logic levels of the selection terminal and the inverted selection terminal. The connection of the input switches of the second group is complementarily opposite to the connection of the input switches of the first group.

17 Claims, 13 Drawing Sheets

| SELECT | INPUT | | OUTPUT | RESULT |
|---|---|---|---|---|
| S | A | B | Y | |
| 0 | 0 | 0 | 1 | NAND |
| 0 | 0 | 1 | 1 | |
| 0 | 1 | 0 | 1 | |
| 0 | 1 | 1 | 0 | |
| 1 | 0 | 0 | 1 | NOR |
| 1 | 0 | 1 | 0 | |
| 1 | 1 | 0 | 0 | |
| 1 | 1 | 1 | 0 | |

| INPUT | | OUTPUT | | | |
|---|---|---|---|---|---|
| A | B | X | Y | F1 | F2 |
| 0 | 0 | 0 | 1 | 1 | 1 |
| 0 | 1 | 1 | 0 | 1 | 0 |
| 1 | 0 | 1 | 0 | 1 | 0 |
| 1 | 1 | 0 | 1 | 0 | 0 |

MULTI-FUNCTIONAL LOGIC GATE DEVICE AND PROGRAMMABLE INTEGRATED CIRCUIT DEVICE USING THE SAME

CROSS-REFERENCE TO RELATED APPLICATIONS

This application claims the benefit of Korean Patent Application No. 10-2007-0119624, filed on Nov. 22, 2007 and Korean Patent Application No. 10-2008-0074089, filed on Jul. 29, 2008, in the Korean Intellectual Property Office, the disclosures of which are incorporated herein in their entireties by reference.

BACKGROUND

The inventive concept relates to integrated circuit devices and, more particularly, to logic gate devices.

In general, a semiconductor integrated circuit may include a combination of various logic gates.

When manufacturing semiconductor integrated circuits, a dummy circuit having logic gates may be used to increase the yield. However, conventionally, the types and total number of logic gates that are to be included in a dummy circuit may be limited. Thus, if a specific logic gate is additionally needed beyond the total number of logic gates included in a dummy circuit, an error may occur. In this manner, the yield may be lowered.

Also, in a programmable integrated circuit, if a logic circuit according to program specifications is formed with logic gates whose logic characteristics have been determined, the total number of logic gates needed may vary according to logic characteristics that are to be programmed. In such cases, there may be a difference in the amounts of logic gates that are required for forming different types of logic characteristics, which may lower usage efficiency.

SUMMARY

Some embodiments of the present invention include a multi-functional logic gate device capable of selectively performing various logic operations by using a single logic circuit. Some embodiments of such devices include a pull-up switching unit having input switches of a first group being respectively connected to multiple input terminals and selection switches of the first group connected to either a selection terminal or a logically inverted selection terminal. The pull-up switching unit may electrically connect the input switches of the first group in a series connection or in a parallel connection between a power source and an output terminal according to logic levels of the selection terminal and the inverted selection terminal. The device may include a pull-down switching unit having input switches of a second group being respectively connected to multiple input terminals and selection switches of the second group connected to either the selection terminal or the inverted selection terminal. The pull-down switching unit may electrically connect the input switches of the second group in a parallel connection or in a series connection between the output terminal and a ground terminal according to the logic levels of the selection terminal and the inverted selection terminal. The series connection or the parallel connection of the input switches of the second group is complementarily opposite to the series connection or the parallel connection of the input switches of the first group.

In some embodiments, the input switches of the first group include first transistors and the input switches of the second group include second transistors that are complementary to the first transistors. Some embodiments provide that the input switches of the first group include PMOS transistors and the input switches of the second group include NMOS transistors. In some embodiments, the selection switches of the first group include PMOS transistors and the selection switches of the second group include NMOS transistors.

In some embodiments, the pull-up switching unit includes a first selection switch and a first input switch connected in series between the power source and the output terminal, a second input switch and a second selection switch connected in series between the power source and the output terminal, and a third selection switch connecting a first node to a second node. The first selection switch and the first input switch may be connected to the first node and the second input switch and the second selection switch may be connected to the second node. Some embodiments provide that the first and second selection switches are switch-controlled according to the logic level of the selection terminal, the third selection switch is switch-controlled according to the logic level of the inverted selection terminal, and the first and second input switches are respectively switch-controlled according to logic levels of first and second input terminals. In some embodiments, the first and second input switches and the first through third selection switches include PMOS transistors.

Some embodiments provide that the pull-down switching unit includes a fourth selection switch and a third input switch connected in series between the output terminal and the ground terminal, a fourth input switch and a fifth selection switch connected in series between the output terminal and the ground terminal, and a sixth selection switch connecting a first node to a second node. In some embodiments, the fourth selection switch and the third input switch are connected to the first node and the fourth input switch and the fifth selection switch are connected to the second node. Some embodiments provide that the fourth and fifth selection switches are switch-controlled according to the logic level of the selection terminal, the sixth selection switch is switch-controlled according to the logic level of the inverted selection terminal, and the third and fourth input switches are respectively switch-controlled according to logic levels of the first and second input terminals. In some embodiments, the third and fourth input switches and the fourth through sixth selection switches include PMOS transistors.

Some embodiments of the present invention include a multi-functional logic gate device that may include a pull-up switching unit having input switches of a first group respectively connected to multiple input terminals and selection switches of the first group connected to a selection terminal. Some embodiments provide that the pull-up switching unit electrically connects the input switches of the first group a series connection or in a parallel connection between a power source and an output terminal according to a logic level of the selection terminal. The device may include a pull-down switching unit having input switches of a second group respectively connected to multiple input terminals and selection switches of the second group connected to a selection terminal. Some embodiments provide that the pull-down switching unit electrically connects the input switches of the second group in a parallel connection or in a series connection between the output terminal and a ground terminal according to the logic level of the selection terminal. The series connection or the parallel connection of the input switches of the second group is complementarily opposite to the series connection or the parallel connection of the input switches of the first group.

Some embodiments provide that the input switches of the first group and the input switches of the second group include complementary transistors. In some embodiments, the input switches of the first group include PMOS transistors and the input switches of the second group include NMOS transistors.

In some embodiments, the pull-up switching unit includes a first selection switch and a first input switch connected in series between the power source and the output terminal, a second input switch and a second selection switch connected in series between the power source and the output terminal, and a third selection switch connecting a node to which the first selection switch and the first input switch are connected to a node to which the second input switch and the second selection switch are connected. Some embodiments provide that the first through third selection switches are switch-controlled according to the logic level of the selection terminal and the first and second input switches are respectively switch-controlled according to logic levels of first and second input terminals. In some embodiments, the first and second input switches and the first and second selection switches include PMOS transistors, and the third selection switch includes an NMOS transistor.

Some embodiments provide that the pull-down switching unit includes a fourth selection switch and a third input switch connected in series between the output terminal and the ground terminal, a fourth input switch and a fifth selection switch connected in series between the output terminal and the ground terminal, and a sixth selection switch connecting a node to which the fourth selection switch and the third input switch are connected to a node to which the fourth input switch and the fifth selection switch are connected. In some embodiments, the fourth through sixth selection switches are switch-controlled according to the logic level of the selection terminal and the third and fourth input switches are respectively switch-controlled according to logic levels of the first and second input terminals. Some embodiments provide that the third and fourth input switches and the fourth and fifth selection switches include PMOS transistors and the sixth selection switch includes an NMOS transistor.

Some embodiments of the present invention include a programmable integrated circuit device that includes a multi-functional logic gate device electrically connecting input switches of a first group in a series connection or in a parallel connection between a power source and an output terminal according to a logic level of a selection terminal and electrically connecting input switches of a second group in a parallel connection or in a series connection between the output terminal and a ground terminal. Some embodiments provide that the parallel connection or series connection of the input switches of the second group is complementarily opposite to the series connection or the parallel connection of the input switches of the first group. A device may include multiple fuses that are operable to determine the logic level of the selection terminal of the multi-functional logic gate device and that are operable to configure the multi-functional logic gate as a NAND gate or a NOR gate responsive to whether the fuses are cut.

In some embodiments, the multi-functional logic gate device includes a pull-up switching unit having the input switches of the first group respectively connected to multiple input terminals and selection switches of the first group connected to one of the selection terminal or a logically inverted selection terminal. The pull-up switching unit may electrically connect the input switches of the first group in a series connection or in a parallel connection between the power source and the output terminal according to logic levels of the selection terminal and the inverted selection terminal. The device includes a pull-down switching unit having the input switches of the second group respectively connected to multiple input terminals and selection switches of the second group connected to one of the selection terminal or the inverted selection terminal. The pull-down switching unit may electrically connect the input switches of the second group in a parallel connection or in a series connection between the output terminal and the ground terminal according to the logic levels of the selection terminal and the inverted selection terminal. The connection of the input switches of the second group is complementarily opposite to the connection of the input switches of the first group.

In some embodiments, the multi-functional logic gate device includes a pull-up switching unit having the input switches of the first group respectively connected to multiple input terminals and selection switches of the first group connected to the selection terminal. The pull-up switching unit may electrically connect the input switches of the first group in a series connection or in a parallel connection between the power source and the output terminal according to the logic level of the selection terminal. The device may include a pull-down switching unit having the input switches of the second group respectively connected to multiple input terminals and selection switches of the second group connected to the selection terminal. The pull-down switching unit may electrically connect the input switches of the second group in a parallel connection or in a series connection between the output terminal and the ground terminal according to the logic level of the selection terminal. The parallel connection or the series connection of the input switches of the second group is complementarily opposite to the series connection or the parallel connection of the input switches of the first group.

Some embodiments include a first pull-up circuit including multiple input switches of a first group that are respectively connected to multiple input terminals and that are connected in series between a power source and a first terminal. Some embodiments include a first pull-down circuit including multiple input switches of a second group that are respectively connected to the input terminals and that are connected in parallel between a second terminal and a ground terminal. Embodiments may include a second pull-up circuit including multiple input switches of a third group that are respectively connected to the input terminals and that are connected in parallel between the power source and a third terminal. A second pull-down circuit may include multiple input switches of a fourth group that are respectively connected to the input terminals and that are connected in series between a fourth terminal and the ground terminal. Some embodiments may include a feedback circuit including multiple switches that are arranged between the first through fourth terminals to respectively generate different logic operation outputs from the first through fourth terminals.

In some embodiments, the input switches of the first group and the input switches of the second group include complementary transistors. Some embodiments provide that the input switches of the third group and the input switches of the fourth group include complementary transistors.

In some embodiments, the input switches of the first group and the input switches of the third group include PMOS transistors and the input switches of the second group and the input switches of the fourth group include NMOS transistors.

Some embodiments provide that, in the feedback circuit, the switches are arranged between the first through fourth terminals in such a manner that logic levels of the first and fourth terminals are determined according to logic levels of the second and third terminals. In some embodiments, in the feedback circuit, the switches are arranged between the first through fourth terminals in such a manner that the result of performing an XNOR logic operation is output from the first terminal, the result of performing a NAND logic operation is output from the second terminal, the result of performing a NOR logic operation is output from the third terminal, and the result of performing an XOR logic operation is output from the fourth terminal.

In some embodiments, in the feedback circuit, the switches are arranged between the first through fourth terminals in such a manner that the fourth terminal is set to be at a logic level '0' based on a logic level of the first terminal when a logic value '0' is input to the input terminals. Some embodiments provide that, in the feedback circuit, the switches are arranged between the first through fourth terminals in such a manner that the first terminal is set to be at a logic level '1' based on a logic level of the fourth terminal when a logic value '1' is input to the input terminals.

Some embodiments provide that, in the feedback circuit, the switches are arranged between the first through fourth terminals in such a manner that the result of performing a NOR logic operation is output from the first terminal when the third terminal is connected to the power source. In some embodiments, the switches in the feedback circuit are arranged between the first through fourth terminals in such a manner that the result of performing a NAND logic operation is output from the fourth terminal when the first terminal is connected to the ground terminal. Some embodiments provide that the feedback circuit includes a first switch electrically connecting or disconnecting the power source and the first terminal according to a logic level of the third terminal, a second switch electrically connecting or disconnecting the first terminal and the second terminal according to the logic level of the third terminal, a third switch electrically connecting or disconnecting the third terminal and the fourth terminal according to a logic level of the second terminal, and a fourth switch electrically connecting or disconnecting the fourth terminal and the ground terminal according to the logic level of the second terminal.

In some embodiments, the first through fourth switches include transistors. Some embodiments provide that each of the first and third switches includes a PMOS transistor and each of the second and fourth switches includes an NMOS transistor.

Some embodiments of the present invention include a programmable integrated circuit device that includes a multi-functional logic gate device having a pair of pull-up circuits and a pair of pull-down circuits each including multiple input switches. The device may include a feedback circuit in which multiple switches are arranged between first through fourth terminals that include points where the two pairs of the pull-up circuits and the pull-down circuits intersect each other, in order to generate different logic operation outputs from the first through fourth terminals. Some embodiments provide that connection of the input switches of each of the pull-up circuits and pull-down circuits is different from connection of the others. Devices may include multiple input terminals respectively connected to the input switches and four output terminals respectively connected to the first through fourth terminals.

In some embodiments, the input switches of the pull-up circuits and the input switches of the pull-down circuits include complementary transistors. Some embodiments provide that the multi-functional logic gate device includes a first pull-up circuit in which input switches of a first group are respectively connected to multiple input terminals and are in series between a power source and a first terminal. A device may include first pull-down circuit in which input switches of a second group are respectively connected to the input terminals and are in parallel between a second terminal and a ground terminal and a second pull-up circuit in which input switches of a third group are respectively connected to the input terminals and are in parallel between the power source and a third terminal. A device may include a second pull-down circuit in which input switches of a fourth group are respectively connected to the input terminals and are in series between a fourth terminal and the ground terminal and a feedback circuit in which the switches are arranged between the first through fourth terminals in order to generate different logic operation outputs from the first through fourth terminals.

In some embodiments, the feedback circuit includes a first switch electrically connecting or disconnecting the power source and the first terminal according to a logic level of the third terminal, a second switch electrically connecting or disconnecting the first terminal and the second terminal according to the logic level of the third terminal, a third switch electrically connecting or disconnecting the third terminal and the fourth terminal according to a logic level of the second terminal, and a fourth switch electrically connecting or disconnecting the fourth terminal and the ground terminal according to the logic level of the second terminal.

Some embodiments provide that each of the first switch and the third switch includes a PMOS transistor and each of the second switch and the fourth switch includes an NMOS transistor. In some embodiments, the result of performing an XNOR logic operation is output from the first terminal, the result of performing a NAND logic operation is output from the second terminal, the result of performing a NOR logic operation is output from the third terminal, and the result of performing an XOR logic operation is output from the fourth terminal.

Some embodiments include multiple fuses that are operable to determine logic levels of two terminals from among the first through fourth terminals and provide that logic operation characteristics of the output terminals are determined according to whether the fuses are cut. In some embodiments, two terminals are selected as output terminals from among the first through fourth terminals, logic levels of the remnant two terminals are determined using the fuses, and logic operation characteristics of the output terminals are determined according to whether the fuses are cut.

BRIEF DESCRIPTION OF THE DRAWINGS

Exemplary embodiments of the invention will be more clearly understood from the following detailed description taken in conjunction with the accompanying drawings in which.

DETAILED DESCRIPTION OF THE EMBODIMENTS

Figure 1:
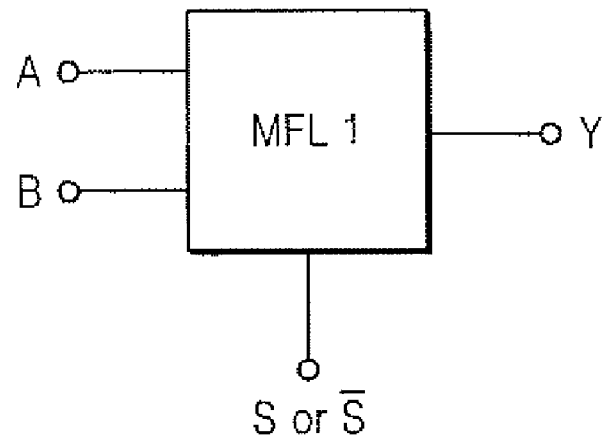
FIG. 1 is a block diagram illustrating the principle of a multi-functional logic gate device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Some embodiments of the present invention include two methods of embodying a multi-functional logic gate device. In a first method, as illustrated in FIG. 1, the logic operation characteristics of a multi-functional logic gate device MFL1 may change according to a logic level of a selection terminal S or $\overline{S}$. That is, the multi-functional logic gate device MFL1 may be designed to be set as a NAND gate circuit or a NOR gate circuit according to logic level of the selection terminal S or $\overline{S}$. In FIG. 1, 'A' and 'B' denote input terminals and 'Y' denotes an output terminal. Thus, a NAND gate operation output or a NOR gate operation output may be output from the output terminal Y according to logic level of the selection terminal S or $\overline{S}$.

Figure 2:
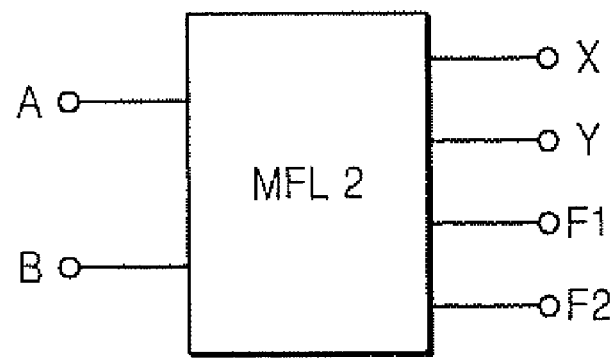
FIG. 2 is a block diagram illustrating the principle of a multi-functional logic gate device according to some embodiments of the present invention.

In a second method, as illustrated in FIG. 2, a plurality of logic operation outputs having different logic operation characteristics may be simultaneously output from a single multi-functional logic gate device MFL2. For example, the multi-functional logic gate device MFL2 may be designed such that output terminals X, Y, F1, and F2 respectively output an XOR logic operation output, an XNOR logic operation output, a NOR logic operation output, and a NAND logic operation output.

Figure 3:
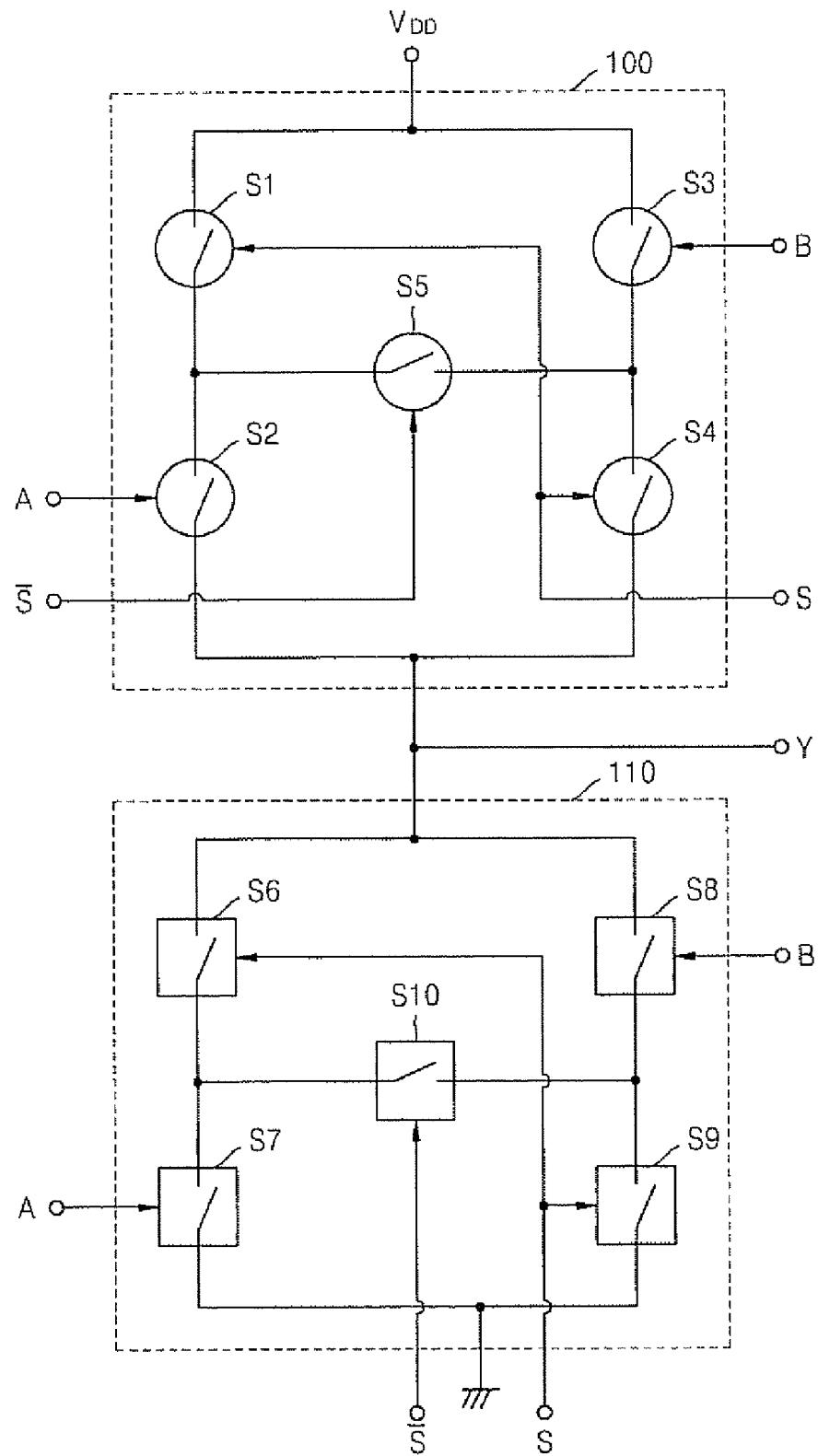
FIG. 3 is a circuit diagram of a multi-functional logic gate device according to some embodiments of the present invention.

First, embodiments of a multi-functional logic gate device as illustrated in FIG. 1 according to the first method will be described. Referring to FIG. 3, a multi-functional logic gate device according to some embodiments of the present invention includes a pull-up switching unit 100 including first through fifth switches S1 through S5 and a pull-down switching unit 110 including sixth through tenth switches S6 through S10.

Some embodiments provide that each of the first through tenth switches S1 through S10 includes first and second terminals and one input terminal. The first and second terminals of the first through tenth switches S1 though S10 may be electrically connected or disconnected according to logic levels of their respective input terminals. As used herein, a switch that is referred to as "connected" is in a closed circuit configuration such that the first and second terminals are electrically continuous and/or have a low resistance therebetween. In contrast, a switch that is referred to as "disconnected" is in an open circuit configuration such that the first and second terminals of the switch are discontinuous and/or have a high resistance therebetween.

More specifically, the first through fifth switches S1 through S5 may be electrically connected when logic levels of their input terminal are '0' and may be electrically disconnected when logic levels of their input terminals are '1'. The sixth through tenth switches S6 through S10 may be electrically connected when logic levels of their input terminals are '1' and may be electrically disconnected when logic levels of their input terminals are '0'. That is, the first through fifth switches S1 through S5 may be complementary to the sixth through tenth switches S6 through S10.

In some embodiments, the first through fifth switches S1 through S5 of the pull-up switching unit 100 are electrically connected between a power source $V_{DD}$ and an output terminal Y. In detail, the first terminals of the first switch S1 and the third switch S3 may be connected to the power source $V_{DD}$, the first and second terminals of the second switch S2 may be respectively connected to the second terminal of the first switch S1 and the output terminal Y, the first and second terminals of the fourth switch S4 may be respectively connected to the second terminal of the third switch S3 and the output terminal Y, and the first and second terminals of the fifth switch S5 may be respectively connected to the second terminal of the first switch S1 and the second terminal of the third switch S3.

The input terminal of the second switch S2 may be set as an input terminal A of a logic circuit and the input terminal of the third switch S3 may be set as an input terminal B of the logic circuit. The input terminals of the first switch S1 and the fourth switch S4 may be set as selection terminals S and the input terminal of the fifth switch S5 may be set as a selection terminal $\overline{S}$, which includes an inverted logic level relative to S. Accordingly, the second and third switches S2 and S3 may operate as input switches and the first, fourth and fifth switches S1, S4, and S5 may operate as selection switches. Based on the above description, the second and third switches S2 and S3 illustrated in FIG. 1 may be respectively referred to as first and second input switches, and the first, fourth and fifth switches S1, S4 and S5 may be respectively referred to as the first, second and third selection switches.

The sixth through tenth switches S6 through S10 of the pull-down switching unit 110 may be electrically connected between the output terminal Y and a ground terminal. More specifically, the output terminal Y may be connected to the first terminals of the sixth switch S6 and the eighth switch S8, the first and second terminals of the seventh switch S7 may be respectively connected to the second terminal of the sixth switch S6 and the ground terminal, the first and second terminals of the ninth switch S9 may be respectively connected to the second terminal of the eighth switch S8 and the ground terminal, and the first and second terminals of the tenth switch S10 may be respectively connected to the second terminal of the sixth switch S6 and the second terminal of the eighth switch S8.

The input terminal of the seventh switch S7 may be set as an input terminal A of a logic circuit and the input terminal of the eighth switch S8 may be set as an input terminal B of the logic circuit. The input terminals of the sixth switch S6 and the ninth switch S9 may be set as selection terminals S and the input terminal of the tenth switch S10 may be set as a selection terminal $\overline{S}$, which includes an inverted logic level relative to S. Thus, the seventh and eighth switches S7 and S8 may operate as input switches and the sixth, ninth, and tenth switches S6, S9, and S10 may operate as selection switches. Based on the above description, the seventh and eighth switches S7 and S8 illustrated in FIG. 1 may be respectively referred to as a third input switch and a fourth input switch, and the sixth, ninth and tenth switches S6, S9 and S10 may be respectively referred to as fourth, fifth, and sixth selection switches.

In some embodiments, the multi-functional logic gate device may include a structure in which the second and third switches S2 and S3 of the pull-up switching unit 100, which are input switches, are electrically connected in series or in parallel between the power source $V_{DD}$ and the output terminal Y according to logic levels of the selection terminal S and the inverted selection terminal $\overline{S}$. Similarly, the seventh and eighth switches S7 and S8 of the pull-down switching unit 110, which are input switches, may be electrically connected in parallel or in series between the output terminal Y and the ground terminal so that their connection may be complementarily opposite to the connection of the input switches of the pull-up switching unit 100.

The logical characteristics of some embodiments of the multi-functional logic gate device that change according to logic levels of the selection terminal S and the inverted selection terminal $\overline{S}$ it will now be described in detail.

First, a case where a selection signal input to the selection terminal S is logic '0' will be described. Note that when the selection signal input to the selection terminal S is logic '0', the inverted selection terminal $\overline{S}$ is at a logic level '1'.

Thus, the first, fourth and fifth switches S1, S4, and S5 may be electrically connected when their input terminals are at a logic level '0' and electrically disconnected when their input terminals are at logic level '1'. For this reason, when the selection signal input to the selection terminal S is logic '0', the first and fourth switches S1 and S4 are electrically connected and the fifth switch S5 is electrically disconnected.

The sixth, ninth, and tenth switches S6, S9, and S10 may be electrically connected when their input terminals are at logic level '1' and electrically disconnected when their input terminals are at logic level '0'. For this reason, when the selection signal input to the selection terminal S is logic '0', the tenth switch S10 is electrically connected and the sixth and ninth switches S6 and S9 are electrically disconnected.

Figure 4:
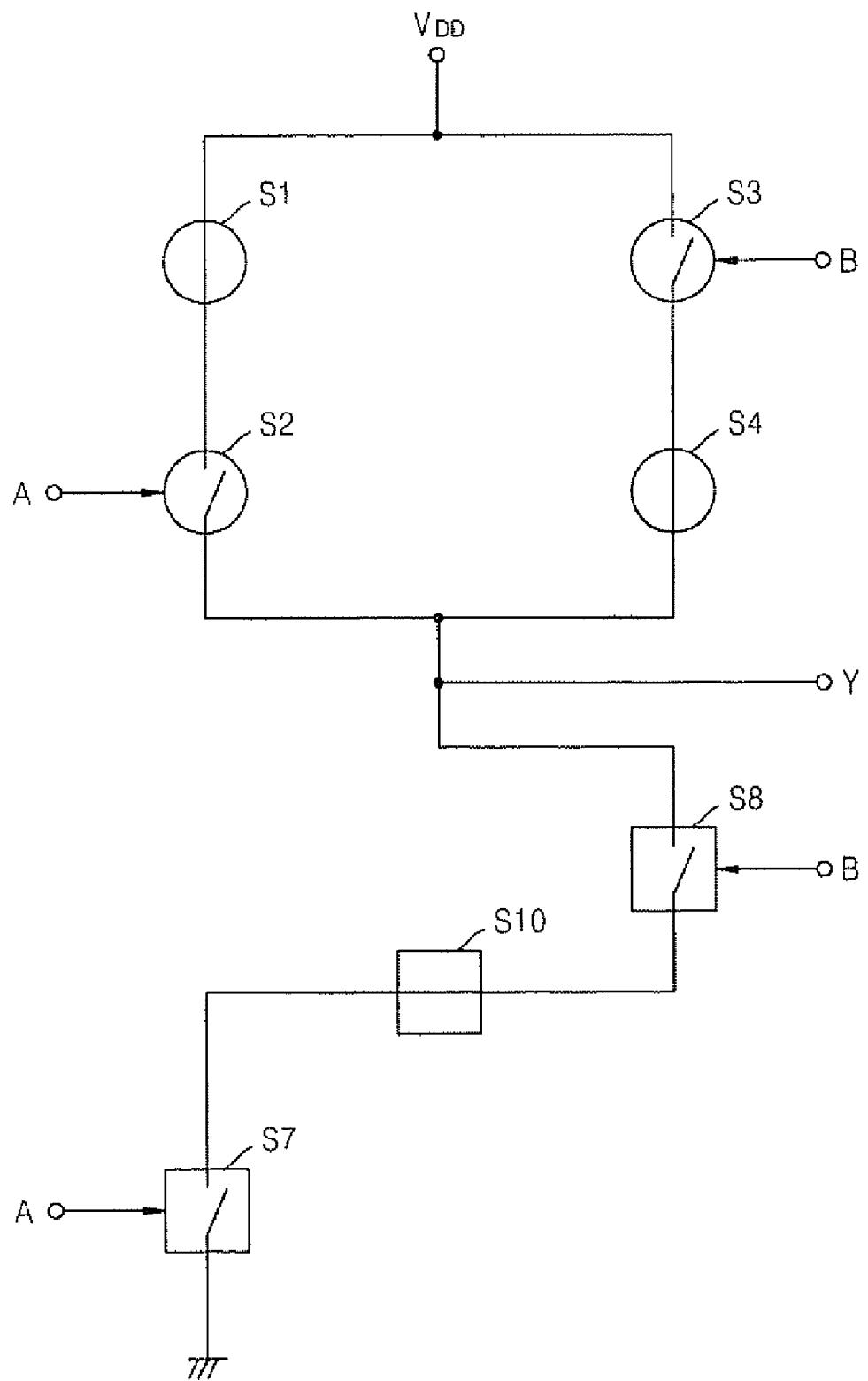
FIG. 4 is an equivalent circuit diagram when a selection terminal S of FIG. 3 is at a logic level '0' according to some embodiments of the present invention.

Thus, if the selection signal input to the selection terminal S is logic '0', the multi-functional logic gate device of FIG. 3 may be represented as an equivalent logic circuit as illustrated in FIG. 4.

As illustrated in embodiments according to FIG. 4, when a selection signal input to a selection terminal S is logic '0', second and third switches S2 and S3 of a pull-up switching unit 100 are connected in parallel between a power source $V_{DD}$ and an output terminal Y. Additionally, seventh and eighth switches S7 and S8 of a pull-down switching unit 110 are connected in series between the output terminal Y and a ground terminal.

In the logic circuit illustrated in FIG. 4, the output terminal Y is at logic level '0' only when both an input terminal A and an input terminal B are at logic level '1'. The output terminal Y is at logic level '1' when at least one of the input terminal A and the input terminal B is at logic '0'. In this regard, the logic circuit of FIG. 4 exhibits NAND logic circuit characteristics.

Next, a case where the selection signal input to the selection terminal S is logic '1' and thus the inverted selection terminal $\overline{S}$ is at logic level '0' will be described.

Referring back to FIG. 3, the first, fourth and fifth switches S1, S4, and S5 are electrically connected when their input terminals are at logic level '0' and are electrically disconnected when their input terminals are at logic level '1'. For this reason, the fifth switch S5 is electrically connected and the first and fourth switches S1 and S4 are electrically disconnected when the selection signal input to the selection terminal S is logic '1' and the inverted selection terminal $\overline{S}$ is at logic level '0'.

The sixth, ninth, and tenth switches S6, S9, and S10 are electrically connected when their input terminals are at logic level '1' and electrically disconnected when their input terminals are at logic level '0'. Thus, the sixth and ninth switches S6 and S9 are electrically connected and the tenth switch S10 is electrically disconnected when the selection signal input to the selection terminal S is logic '1' and the inverted selection terminal $\overline{S}$ is at logic level '0'.

Figure 5:
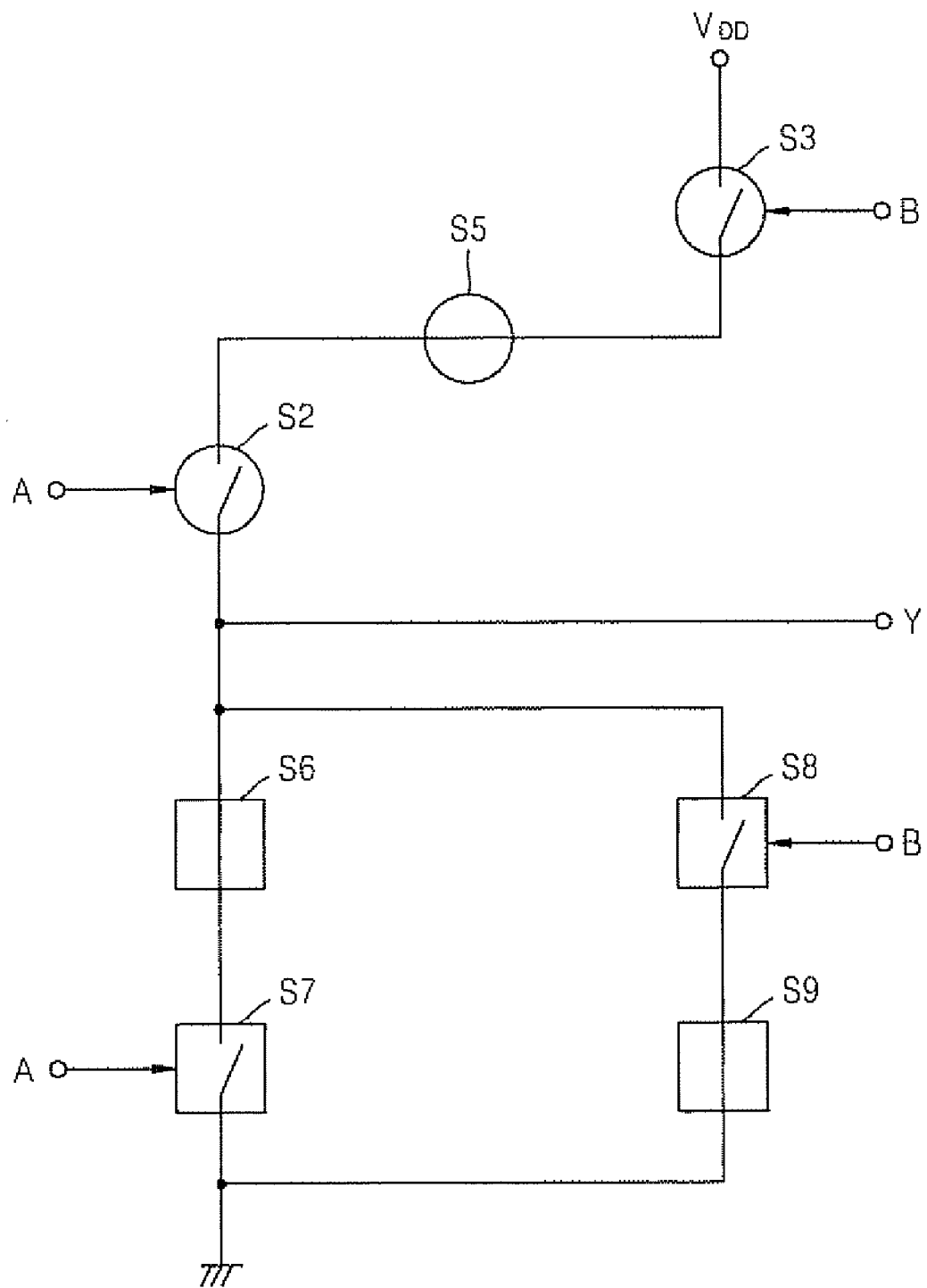
FIG. 5 is an equivalent circuit diagram when the selection terminal S of FIG. 3 is at a logic level '1' according to some embodiments of the present invention.

Thus, if the selection signal input to the selection terminal S is logic '1', the multi-functional logic gate device of FIG. 3 may be represented as an equivalent logic circuit as illustrated in FIG. 5.

As illustrated in FIG. 5, when a selection signal input to a selection terminal S is logic '1', second and third switches S2 and S3 of a pull-up switching unit 100 are connected in series between a power source $V_{DD}$ and an output terminal Y, and seventh and eighth switches S7 and S8 of a pull-down switching unit 110 are connected in parallel between the output terminal Y and a ground terminal.

In the logic circuit of FIG. 5, the output terminal Y is at logic level '1' when both the input terminal A and the input terminal B are at logic level '0'. The output terminal Y is at logic level '0' when at least one of the input terminal A and the input terminal B is at logic level '1'. That is, the logic circuit of FIG. 5 exhibits NOR logic circuit characteristics.

Figures 11, 12:
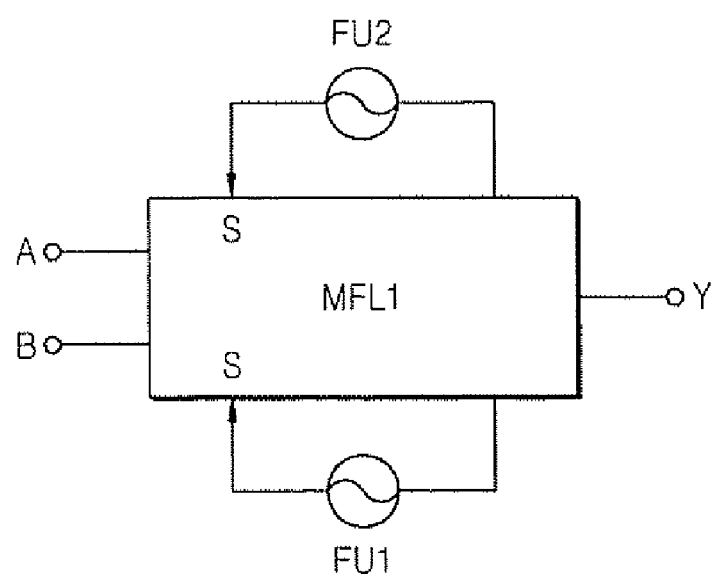
FIG. 11 illustrates a truth table of the multi-functional logic gate device illustrated in FIGS. 3 and 6.
FIG. 12 is a block diagram illustrating application of a multi-functional logic gate device to a programmable integrated circuit device according to some embodiments of the present invention.

As described above, the logic circuit of FIG. 3 operates as a NAND gate circuit when the selection terminal S is at logic level '0' and operates as a NOR gate circuit when the selection terminal S is at logic level '1'. A truth table regarding the logic circuit of FIG. 3 is illustrated in FIG. 11.

Figure 6:
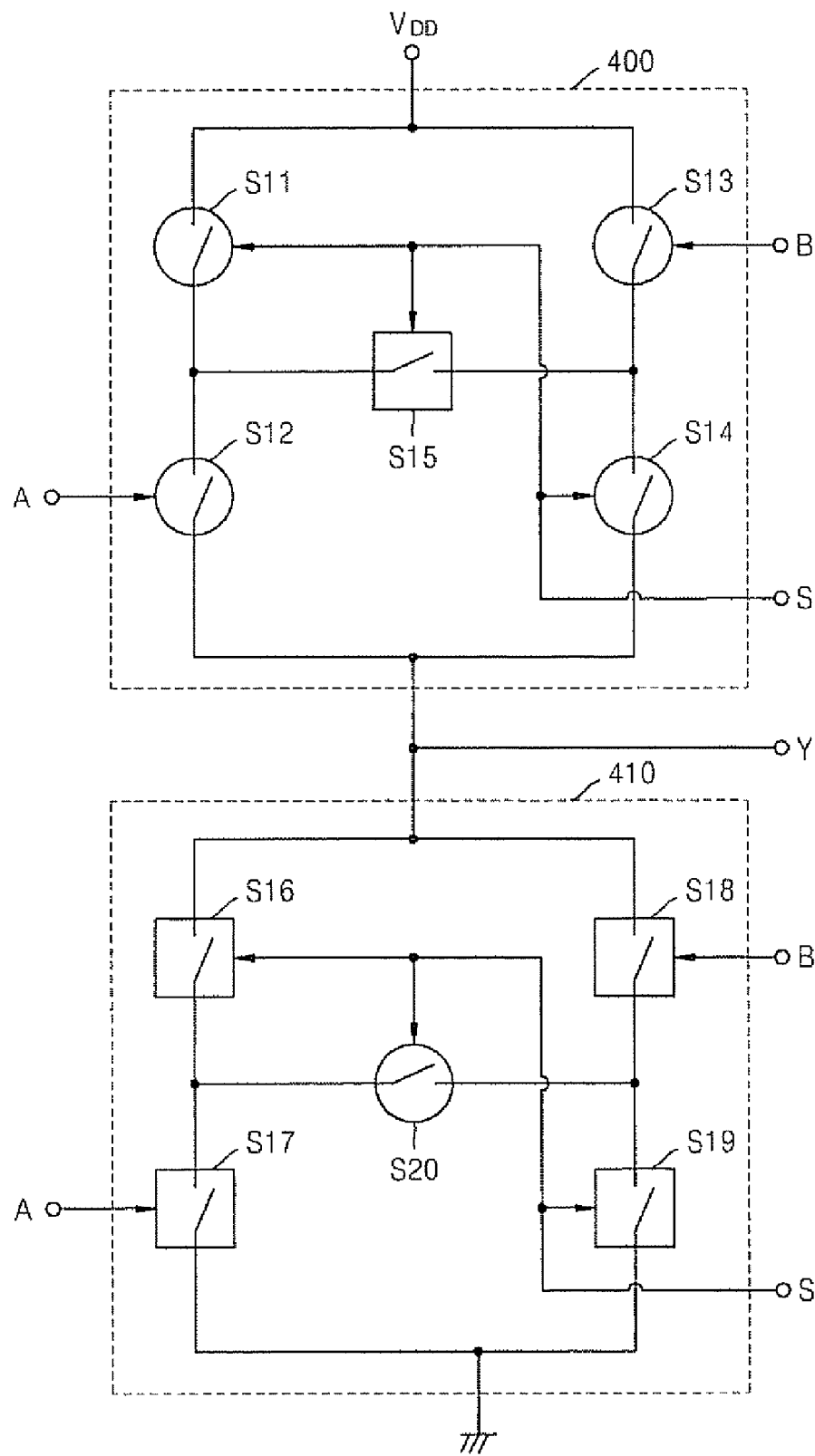
FIG. 6 is a circuit diagram of a multi-functional logic gate device according to some embodiments of the present invention.

Reference is now made to FIG. 6, which illustrates a circuit diagram of a multi-functional logic gate device according to some embodiments of the present invention. In contrast with the multi-functional logic gate device of FIG. 3, which uses inputs to be provided to the selection terminal S and the inverted selection terminal $\overline{S}$ in order to determine logic characteristics thereof, the multi-functional logic gate device of FIG. 6 may receive an input to be provided to a selection terminal S in order to determine logic characteristics thereof.

The multi-functional logic gate device includes a pull up switching unit 400 including eleventh through fifteenth switches S11 through S15 and a pull-down switching unit 410 including sixteenth through twentieth switches S16 through S20.

Each of the eleventh through twentieth switches S11 through S20 includes first and second terminal and one input terminal. The first and second terminals of switches S11 through S20 may be electrically connected or disconnected according to logic levels of their respective input terminals.

For example, the eleventh through fourteenth switches S11 through S14 and the twentieth switch S20 may be electrically connected when their input terminals are at a logic level '0' and may be electrically disconnected when their input terminals are at logic level '1'. The fifteenth through nineteenth switches S15 through S19 may be electrically connected when its input terminal is at logic level '1' and electrically disconnected when its input terminal is at logic level '0'.

The eleventh through fifteenth switches S11 through S15 of the pull-up switching unit 400 may be electrically connected between a power source $V_{DD}$ and an output terminal Y. In detail, the power source $V_{DD}$ may be connected to the first terminals of the eleventh switch S11 and the thirteenth switch S13, the first and second terminals of the twelfth switch S12 may be respectively connected to the second terminal of the eleventh switch S11 and the output terminal Y, the first and second terminals of the fourteenth switch S14 may be respectively connected to the second terminal of the thirteenth switch S13 and the output terminal Y, and the first and second terminals of the fifteenth switch S15 may be respectively connected to the second terminals of the eleventh switch S11 and the thirteenth switch S13.

The input terminal of the twelfth switch S12 may be set as an input terminal A of a logic circuit and the input terminal of the thirteenth switch S13 may be set as an input terminal B of the logic circuit. The input terminals of the eleventh, fourteenth and fifteenth switches S11, S14, and S15 are set as selection terminals S. Thus, the twelfth and thirteenth switch S12 and S13 may operate as input switches and the eleventh, fourteenth and fifteenth switches S11, S14, and S15 may operate as selection switches. Based on the above description, the switches S12 and S11 illustrated in FIG. 6 may be respectively referred as first and second input switches. Similarly, the eleventh, fourteenth and fifteenth switches S11, S14 and S15 may be respectively referred to as first, second and third selection switches.

The sixteenth through twentieth switches S16 through S20 of the pull-down switching unit 410 may be electrically connected between the output terminal Y and a ground terminal. In detail, the output terminal Y may be connected to the first terminals of the sixteenth switch S16 and the eighteenth switch S18, the first and second terminals of the seventeenth switch S17 may be respectively connected to the second terminal of the sixteenth switch S16 and the ground terminal, the first and second terminals of the nineteenth switch S19 may be respectively connected to the second terminal of the eighteenth switch S18 and the ground terminal, and the first and second terminals of the twentieth switch S20 may be respectively connected to the second terminals of the sixteenth switch S16 and the eighteenth switch S18.

The input terminal of the seventh switch S17 may be set as an input terminal A of a logic circuit, and the input terminal of the eighteenth switch S18 may be set as an input terminal B of the logic circuit. The input terminals of the sixteenth, nineteenth, and twentieth switches S16, S19, and S20 may be set as selection terminals S. Thus, the seventeenth and eighteenth switches S17 and S18 may operate as input switches and the sixteenth, nineteenth and twentieth switches S16, S19, and S20 may operate as selection switches. Based on the above description, the seventeenth and eighteenth switches S17 and S18 may be respectively referred to as third and fourth input switches, and the sixteenth, nineteenth and twentieth switches S16, S19 and S20 may be respectively referred to as fourth, fifth and sixth selection switches.

The multi-functional logic gate device according to the current embodiment has a structure in which the twelfth and thirteenth switches S12 and S13 of the pull-up switching unit 400, which are input switches, may be electrically connected in series or in parallel between the power source $V_{DD}$ and the output terminal Y according to logic level of the selection terminal S. The seventeenth and eighteenth switches S17 and S18 of the pull-down switching unit 410, which are input switches, may be electrically connected in parallel or in series between the output terminal Y and the ground terminal so that their connection may be complementarily opposite to the connection of the input switches of the pull-up switching unit 100.

The logical characteristics of the multi-functional logic gate device that change according to logic level of the selection terminal S will now be described in detail. First, a case where a selection signal input to the selection terminal S is logic '0' is described.

The eleventh and fourteenth switches S11 and S14 may be electrically connected when their input terminals are at logic level '0' and may be electrically disconnected when their input terminals are at logic level '1'. The fifteenth switch S15 may be electrically connected when its input terminal is at logic level '1' and electrically disconnected when its input terminal is at logic level '0'.

Thus, when the selection signal input to the selection terminal S is logic '0', the eleventh and fourteenth switches S11 and S14 may be electrically connected and the fifteenth switch S15 may be electrically disconnected.

The sixteenth and nineteenth switches S16 and S19 may be electrically connected when their input terminals are at logic level '1' and electrically disconnected when their input terminals are at logic level '0'. The twentieth switch S20 may be electrically connected when its input terminal is at logic level '0' and electrically disconnected when its input terminal is at logic level '1'.

Accordingly, if the selection signal input to the selection terminal S is logic '0', the twentieth switch S20 may be electrically connected and the sixteenth and nineteenth switches S16 and S19 may be electrically disconnected.

Figure 7:
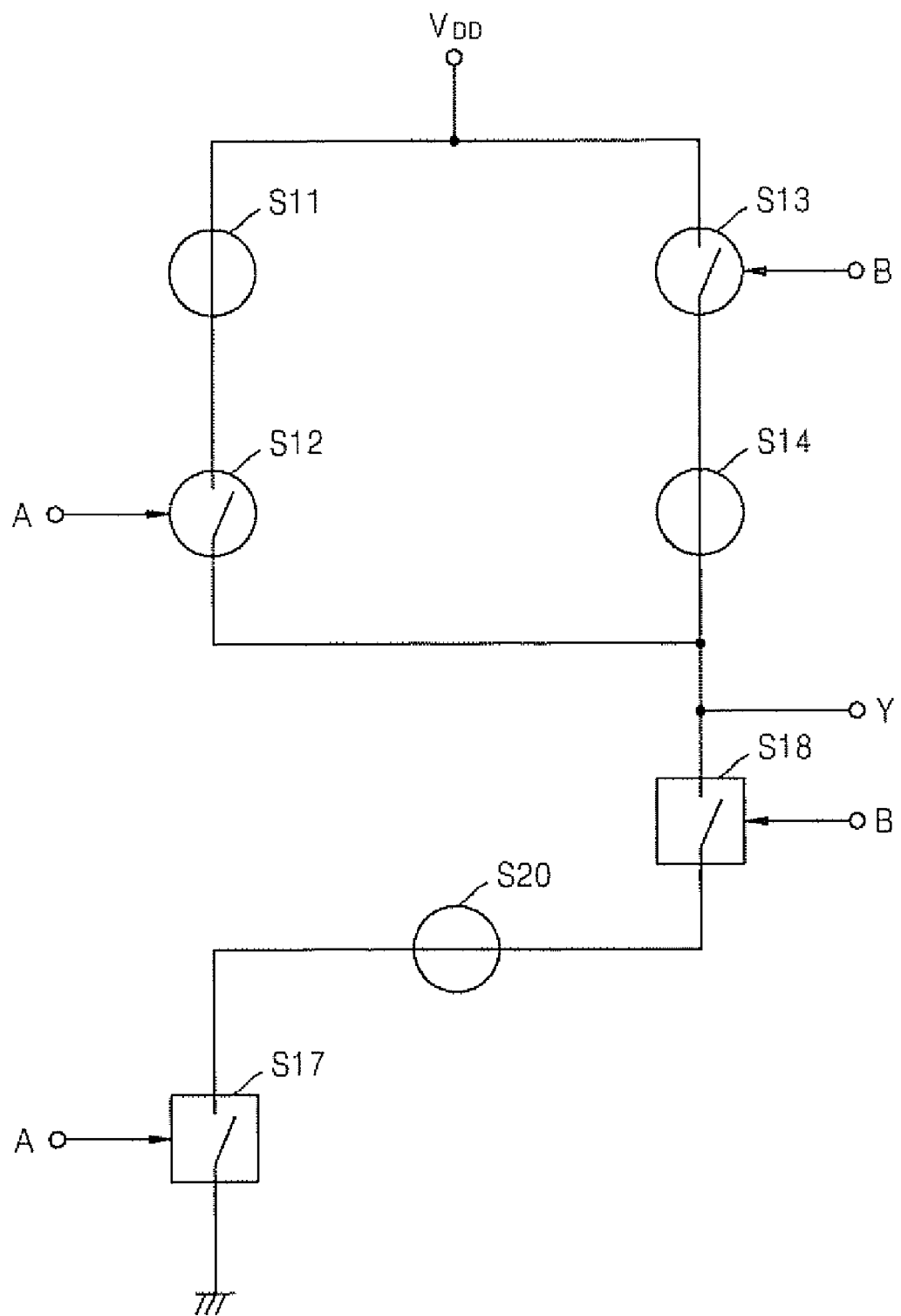
FIG. 7 is an equivalent circuit diagram when a selection terminal S of FIG. 6 is at a logic level '0' according to some embodiments of the present invention.

Reference is now made to FIG. 7, which is logic circuit equivalent to the multi-functional logic gate device of FIG. 6 when the selection signal input to the selection terminal S is logic '0'. As illustrated in FIG. 7, when a selection signal input to a selection terminal S is logic '0', twelfth and thirteenth switches S12 and S13 of a pull-up switching unit 400 may be connected in parallel between a power source $V_{DD}$ and an output terminal Y. Additionally, seventeenth and eighteenth switches S17 and S18 of a pull-down switching unit 410 may be connected in series between the output terminal Y and a ground terminal.

In the logic circuit of FIG. 7, the output terminal Y is at logic level '0' when both an input terminal A and an input terminal B are at logic level '1' and the output terminal Y is at logic level '1' when at least one of the input terminal A and the input terminal B is at logic level '0'. That is, the logic circuit of FIG. 7 exhibits NAND logic circuit characteristics.

The case where the selection signal input to the selection terminal S is logic '1' will now be described. The eleventh and fourteenth switches S11 and S14 may be electrically connected when their input terminals are at logic level '0' and may be electrically disconnected when their input terminals are at logic level '1'. The fifteenth switch S15 may be electrically connected when its input terminal is at logic level '1' and electrically disconnected when its input terminal is at logic level '0'. Therefore, the fifteenth switch S15 may be electrically connected and the eleventh and fourteenth switches S11 and S14 may be electrically disconnected if the selection signal input to the selection terminal S is logic '1'.

The sixteen and nineteenth switches S16 and S19 may be electrically connected when their input terminals are at logic level '1' and electrically disconnected when their input terminals are at logic level '0'. The twentieth switch S20 may be electrically connected when its input terminal is at logic level '0' and electrically disconnected when its input terminal is at logic level '1'. Accordingly, the sixteen and nineteenth switches S16 and S19 may be electrically connected and the twentieth switch S20 may be electrically disconnected if the selection signal input to the selection terminal S is logic '1'.

Figure 8:
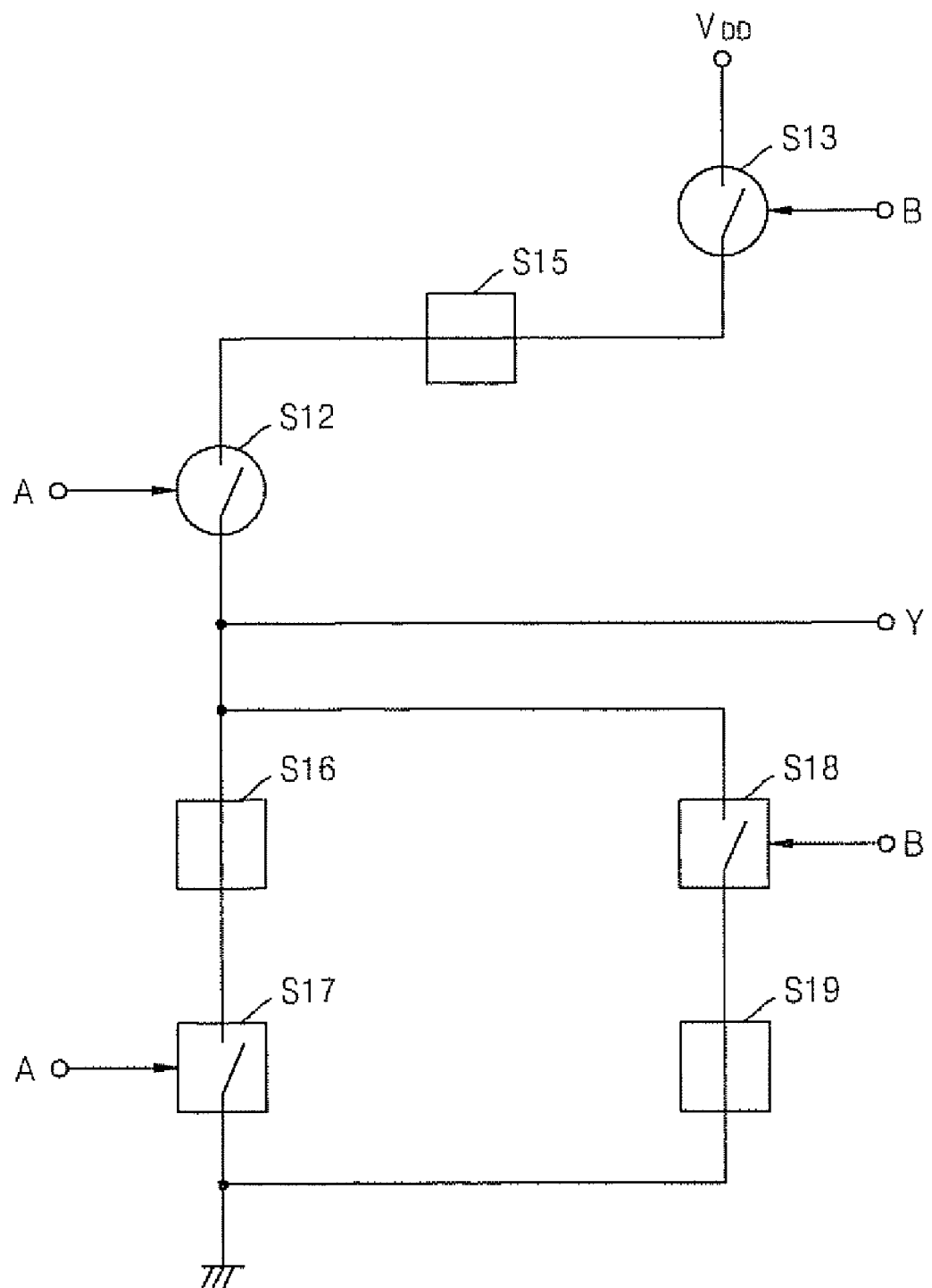
FIG. 8 is an equivalent circuit diagram when the selection terminal S of FIG. 6 is at a logic level '1' according to some embodiments of the present invention.

Accordingly, when the selection signal input to the selection terminal S is logic '1', the multifunctional logic gate device of FIG. 6 may be represented as an equivalent logic circuit as illustrated in FIG. 8. As illustrated in FIG. 8, when a selection signal input to a selection terminal S is logic '1', twelfth and thirteenth switches S12 and S13 of a pull-up switching unit 400 may be connected in series between a power source $V_{DD}$ and an output terminal Y, and seventeenth and eighteenth switches S17 and switch S18 of a pull-down switching unit 410 may be connected in parallel between the output terminal Y and a ground terminal.

The output terminal Y may be at logic level '1' when both an input terminal A and an input terminal B are at logic level '0' and may be at logic level '0' when at least one of the input terminal A and the input terminal B is at logic level '1'. That is, the logic circuit of FIG. 8 exhibits NOR logic circuit characteristics.

In this regard, the logic circuit of FIG. 6 may operate as a NAND gate circuit when the selection terminal S is at logic level '0' and may operate as a NOR gate circuit when the selection terminal S is at logic level '1'. A truth table regarding the logic circuit of FIG. 6 is illustrated in FIG. 11.

In some embodiments, the above switches illustrated in FIGS. 3 and 6 may be transistors. For example, referring to FIGS. 9 and 10, the above switches may be metallic oxide semiconductor field effect transistors (MOSFETs). However, switches according to embodiments of the present invention are not limited to the MOSFETs. For example, some embodiments provide that the switches may include various types of devices having switching characteristics that are switched on/off according to logic level of an input terminal.

Figure 9:
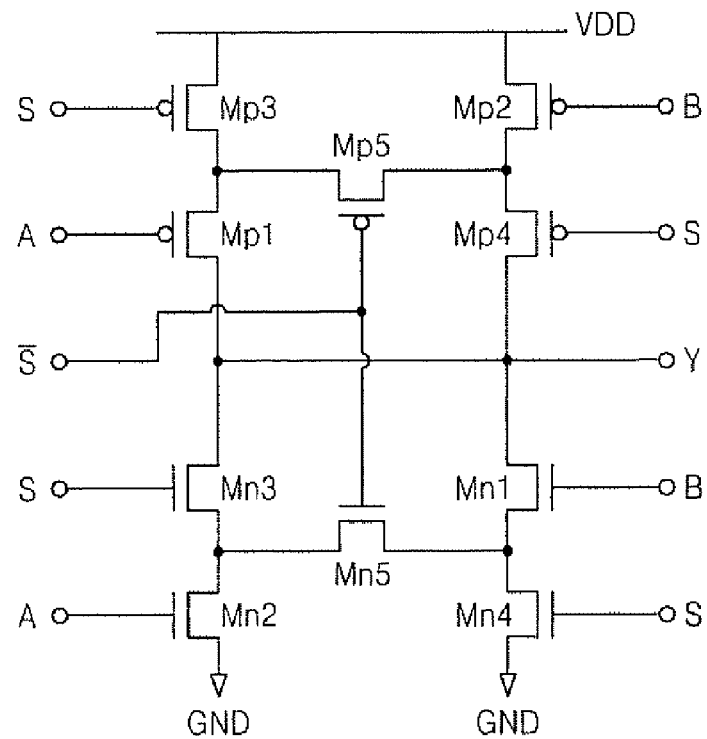
FIG. 9 is a circuit diagram of a metallic oxide semiconductor field effect transistor (MOSFET) formed of switches illustrated in FIG. 3 according to some embodiments of the present invention.

FIG. 9 illustrates a case where the switches included in the multi-functional logic gate device of FIG. 3 are MOSFETs according to some embodiments of the present invention. Referring to FIG. 9, a pull-up switching unit includes PMOS transistors Mp1 through Mp5 and a pull-down switching unit includes NMOS transistors Mn1 through Mn5, thereby forming a complementary metal oxide semiconductor (CMOS) logic circuit.

In use and operation, if a selection terminal S is at logic level '0', the PMOS transistors Mp3 and Mp4, the gate terminals of which are connected to the selection terminal S, may be electrically connected. Additionally, the PMOS transistor Mp5, the gate terminal of which is connected to an inverted selection terminal $\overline{S}$, may be electrically connected.

Further, if the selection terminal S is at logic level '0', the NMOS transistors Mn3 and Mn4, the gate terminals of which are connected to the selection terminal S, may be electrically disconnected. Additionally, the NMOS transistor Mn5, the gate terminal of which is connected to the selection terminal $\overline{S}$, may be electrically connected.

Thus, if the selection terminal S is at logic level '0', the PMOS transistors Mp1 and Mp2 may be connected in parallel between a power source $V_{DD}$ and an output terminal Y and the NMOS transistors Mn1 and Mn2 may be connected in series between the output terminal Y and a ground terminal GND. In such a connection structure, when both input terminals A and B are at logic level '1', the output terminal Y may be at logic level '0' since the NMOS transistors Mn1 and Mn2 may be electrically connected and the PMOS transistors Mp1 and Mp2 may be disconnected. In this regard, when at least one of the input terminals A and B is at logic level '0', the output terminal may be at logic level '1'. Accordingly, when the selection terminal S is at logic level '0', NAND logic gate characteristics may be generated.

If the selection terminal S is at logic level '1', the PMOS transistors Mp3 and Mp4, the gate terminals of which are connected to the selection terminal S, may be electrically connected. Further, the PMOS transistor Mp5, the gate terminal of which is connected to the inverted selection terminal $\overline{S}$, may be electrically connected.

Also, if the selection terminal S is at logic level '1', the NMOS transistors Mn3 and Mn4, the gate terminals of which are connected to the selection terminal S, may be electrically connected. Further, the NMOS transistor Mn5, the gate terminal of which is connected to the inverted selection terminal $\overline{S}$, may be electrically disconnected.

Thus, if the selection terminal S is at logic level '1', the PMOS transistors Mp1 and Mp2 may be connected in series between the power source $V_{DD}$ and the output terminal Y. Further, the NMOS transistors Mn1 and Mn2 may be connected in parallel between the output terminal Y and the ground terminal GND. In such a connection structure, when both the input terminals A and B are at logic level '0', the output terminal Y may be at logic level '1' since the NMOS transistors Mn1 and Mn2 are electrically disconnected and the PMOS transistors Mp1 and Mp2 may be electrically connected. Additionally, when at least one of the input terminals A and B is at logic level '1', the output terminal Y may be at logic level '0'. Thus, if the selection terminal S is at logic level '1', NOR logic gate characteristics may be generated.

Accordingly, the multi-functional logic gate device of FIG. 9 operates as a NAND gate circuit when the selection terminal S is at logic level '0' and operates as a NOR gate circuit when the selection terminal S is at logic level '1'.

Figure 10:
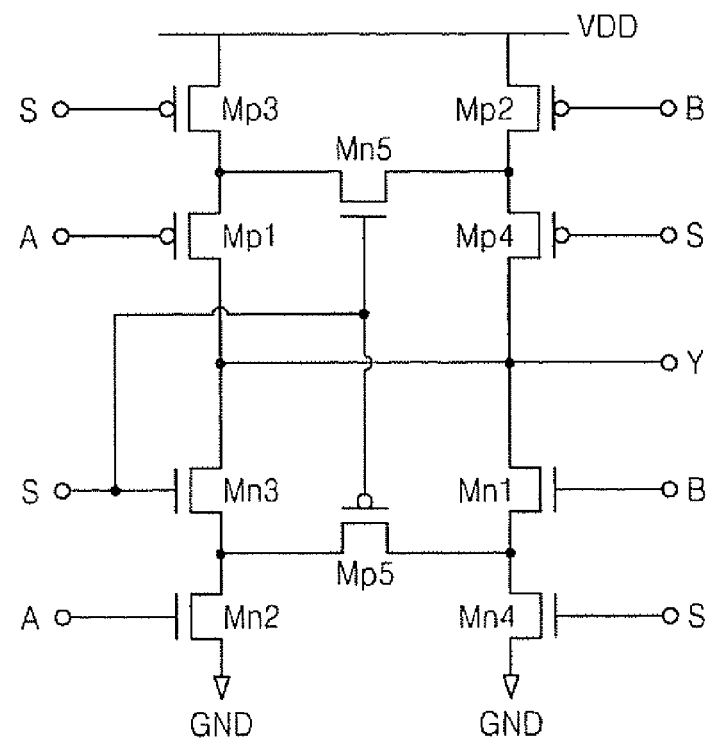
FIG. 10 is a circuit diagram of a MOSFET formed of switches illustrated in FIG. 6 according to some embodiments of the present invention.

Reference is now made to FIG. 10, which illustrates a case where the switches included in the multi-functional logic gate device of FIG. 6 comprise MOSFETs according to some embodiments of the present invention. In use and operation, if a selection terminal S is at logic level '0', PMOS transistors Mp3 and Mp4, the gate terminals of which are connected to the selection terminal S, may be electrically connected and an NMOS transistor Mn5 may be electrically disconnected.

If the selection terminal S is at logic level '0', NMOS transistors Mn3 and Mn4, the gate terminals of which are connected to the selection terminal S, may be electrically disconnected and a PMOS transistor Mp5 may be electrically connected.

Thus, if the selection terminal S is at logic level '0', PMOS transistors Mp1 and Mp2 may be connected in parallel between a power source $V_{DD}$ and an output terminal Y and NMOS transistors Mn1 and Mn2 may be connected in series between the output terminal Y and a ground terminal GND. In such a connection structure, NAND logic gate characteristics may be generated as also described above with reference to FIG. 9.

If the selection terminal S is at logic level '1', the PMOS transistors Mp3 and Mp4, the gate terminals of which are connected to the selection terminal S, may be electrically disconnected and the NMOS transistor Mn5 may be electrically connected.

If the selection terminal S is at logic level '1', the NMOS transistors Mn3 and Mn4, the gate terminals of which are connected to the selection terminal S, may be electrically connected and the PMOS transistor Mp5 may be electrically disconnected.

Thus, if the selection terminal S is at logic level '1', the PMOS transistors Mp1 and Mp2 may be connected in series between the power source $V_{DD}$ and the output terminal Y and the NMOS transistors Mn1 and Mn2 may be connected in parallel between the output terminal Y and the ground terminal GND). In such a connection structure, NOR gate characteristics may be generated as described above with reference to FIG. 9.

Accordingly, the multi-functional logic gate device of FIG. 10 may operate as a NAND) gate circuit when the selection terminal S is at logic level '0' and may operate as a NOR gate circuit when the selection terminal S is at logic level '1'.

A semiconductor integrated circuit including a multi-functional logic gate device as illustrated in FIG. 3, 6, 9, or 10 will now be described. Reference is made to FIG. 12, which is a block diagram illustrating use of a multi-functional logic gate device MFL1 that operates as a NAND gate or a NOR gate according to a logic level of a selection terminal S, in a programmable integrated circuit according to some embodiments of the present invention. As illustrated in FIG. 12, 'FU1' and 'FU2' denote fuses. First terminals of the fuses FU1 and FU2 may be respectively connected to selection terminals S of the multi-functional logic gate device MFL1. Second terminals of the fuses FU1 and FU2 may be connected to a terminal that is at logic level '1' and/or a ground terminal.

In general, a programmable integrated circuit may include a plurality of NAND gates and NOR gates. It is possible to set the multi-functional logic gate device MFL1 as a NAND gate circuit or a NOR gate circuit by disposing the multi-functional logic gate device MFL1 in a programmable integrated circuit and cutting one of the fuses FU1 and FU2. As described herein, cutting a fuse results in an electrically discontinuous or open circuit between the terminals thereof.

In some embodiments, it may be assumed that the multi-functional logic gate device MFL1 is identical to the circuit illustrated in FIG. 1, 4, 7, or 8. Additionally, the second terminal of the fuse F1 may be connected to the terminal that is at logic level '1' and the second terminal of the fuse F2 may be connected to the ground terminal that is at logic level '0'.

Some embodiments provide that the fuse F2 may be cut in order to use the multi-functional logic gate device MFL1 as a NAND gate circuit according to the program specifications determined by the programmable integrated circuit. In some embodiments, the fuse F1 may be cut in order to use the multi-functional logic gate device MFL1 as a NOR gate circuit.

For example, a fuse may be cut by flowing excess or over current through the fuse. Circuits for cutting fuse are well known in the art and thus the construction and detailed description of such circuits are omitted herein.

Figure 13:
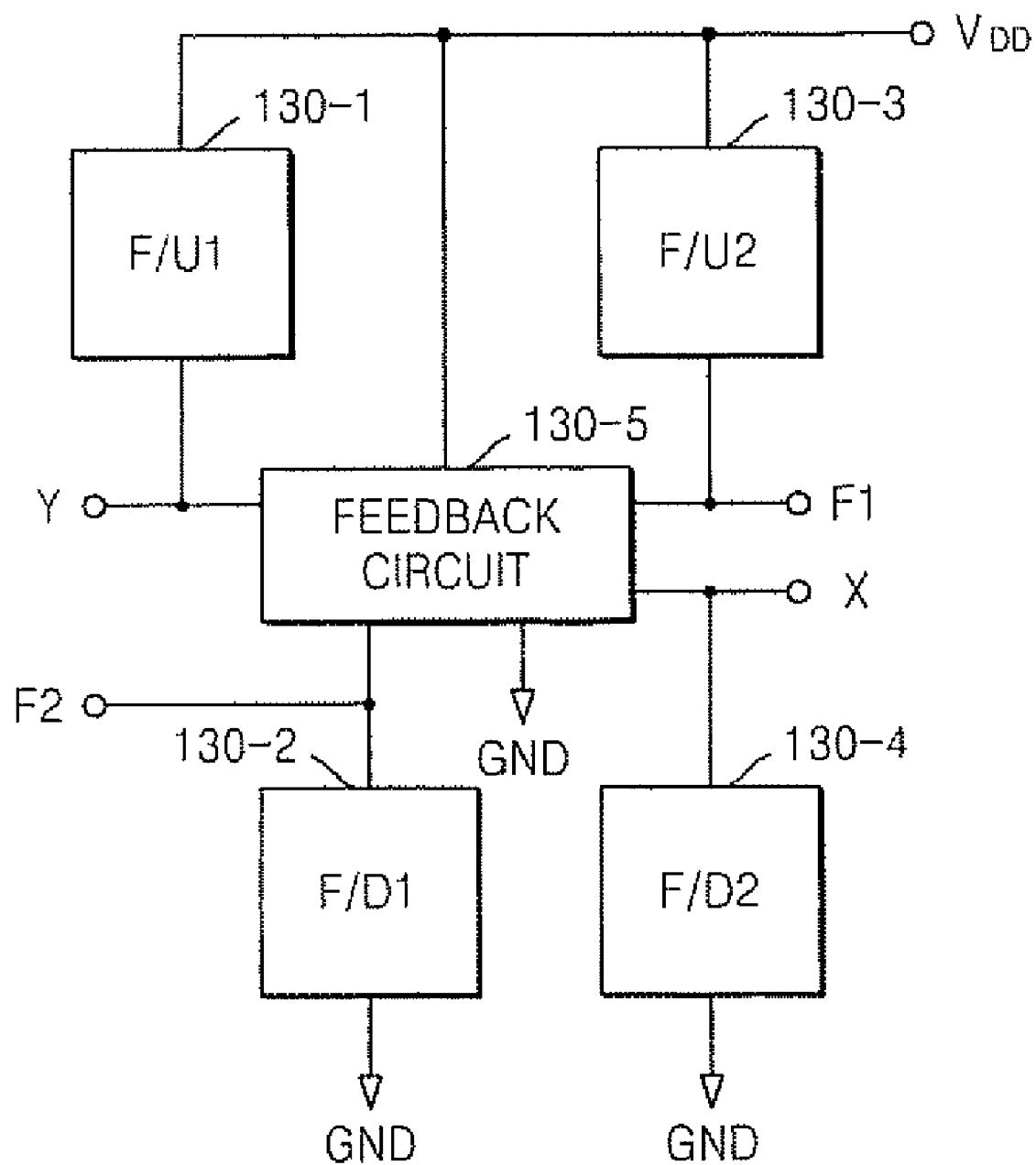
FIG. 13 is a circuit diagram of a multi-functional logic gate device according to some embodiments of the present invention.

Next, a multi-functional logic gate device as illustrated in FIG. 2 according to embodiments of a second method will be described. Reference is now made to FIG. 13, which is a block diagram illustrating a multifunctional logic gate device according to some embodiments of the present invention. In some embodiments, the device includes a first pull-up circuit (F/U1) 130-1, a first pull-down circuit (F/D1) 130-2, a second pull-up circuit (F/U2) 130-3, a second pull-down circuit (F/D2) 130-4, and a feedback circuit 130-5.

Some embodiments provide that the first pull-up circuit 130-1 includes a structure in which input switches of a first group are respectively connected to a plurality of input terminals that are in series between a power source $V_{DD}$ and a first terminal Y.

In some embodiments, the first pull-down circuit 130-2 includes a structure in which switches of a second group that are respectively connected to a plurality of input terminals that are in parallel between a second terminal F2 and a ground terminal GND.

Some embodiments provide that the second pull-up circuit 130-3 includes a structure in which switches of a third group that are respectively connected to a plurality of input terminals that are in parallel between the power source $V_{DD}$ and a third terminal F3.

In some embodiments, the second pull-down circuit 130-4 includes a structure in which switches of a fourth group that are respectively connected to a plurality of input terminals that are in series between a fourth terminal X and the ground terminal GND.

Some embodiments provide that the feedback circuit 130-5 includes a structure in which a plurality of switches are arranged between first through fourth terminals so that the first through fourth terminals generate different logic operation outputs.

Figure 14:
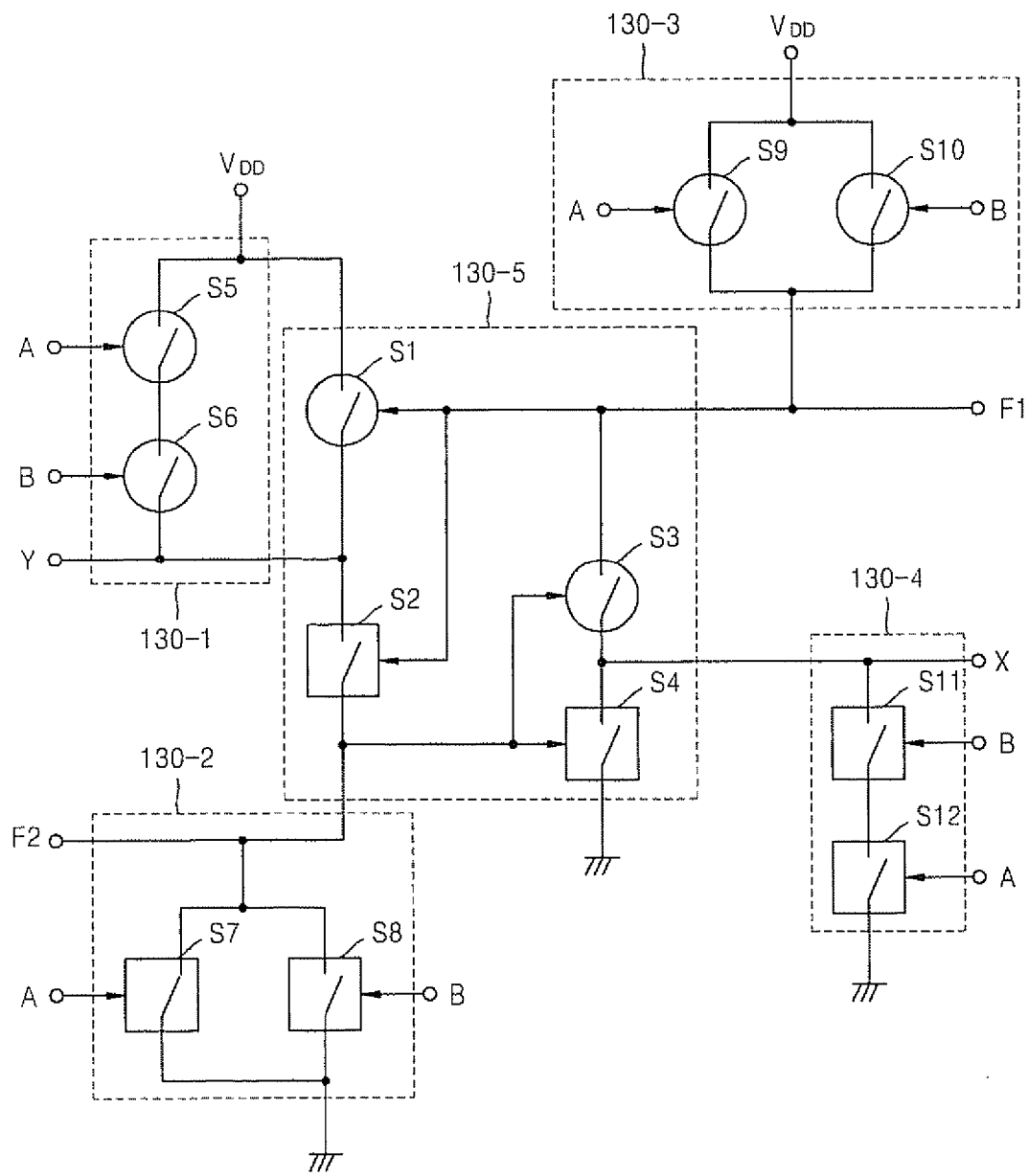
FIG. 14 is a circuit diagram illustrating in detail the multi-functional logic gate device of FIG. 13 according to some embodiments of the present invention.

Reference is now made to FIG. 14, which is a circuit diagram illustrating in detail the multi-functional logic gate device of FIG. 13 according to some embodiments of the present invention. Some embodiments provide that the first pull-up circuit 130-1 includes a structure in which a switch S5 and a switch S6 are connected in series between a power source $V_{DD}$ and a first terminal Y. In some embodiments, the first pull-down circuit 130-2 includes a structure in which a switch S7 and a switch S8 are connected in parallel between a second terminal F2 and a ground terminal. Some embodiments provide that the second pull-up circuit 130-3 includes a structure in which a switch 89 and a switch S10 are connected in parallel between the power source $V_{DD}$ and a third terminal F1. In some embodiments, the second pull-down circuit 130-4 includes a structure in which a switch S11 and a switch S12 are connected in series between a fourth terminal X and a ground terminal. Some embodiments provide that the switches S5 through S12 are input switches that may be electrically connected or disconnected according to logic level of an input terminal A or B.

Some embodiments provide that the feedback circuit 130-5 may be embodied as four switches S1 through S4. More specifically, the switch S1 may be connected between the power source $V_{DD}$ and the first terminal Y and may be electrically connected or disconnected according to logic level of the third terminal F1. The switch S2 may be connected between the first terminal Y and the second terminal F2 and may be electrically connected or disconnected according to logic level of the third terminal F1. The switch S3 may be connected between the third terminal F1 and the fourth terminal X and may be electrically connected or disconnected according to logic level of the second terminal F2. The switch 84 may be connected between the fourth terminal X and the ground terminal and may be electrically connected or disconnected according to logic level of the second terminal F2.

The above switches S1, S3, S5, S6, S9, and S10 may be electrically connected when their input terminals are at logic level '0' and may be electrically disconnected when their input terminals are at logic level '1'. The switches S2, S4, S7, S8, S11, and S12 may be electrically connected when their input terminals are at logic level '1' and may be electrically disconnected when their input terminals are at logic level '0'.

Switches S5 and S6 of the first pull-up circuit 130-1 may be complementary to the switches S7 and S8 of first pull-down circuit 130-2 and switches S9 and S10 of the second pull-up circuit 130-3 may be complementary to the switches S11 and S12 of the second pull-down circuit 130-4.

The operation of some embodiments of the multi-functional logic gate device when a logic value '0' is input to both the input terminals A and B is now described. Since both the input terminals A and B are at logic level '0', all the switches S5 and S6 of the first pull-up circuit 130-1 and the switches S9 and S10 of the second pull-up circuit 130-3 may be electrically connected and all the switches S7 and S8 of the first pull-down circuit 130-2 and the switches S11 and S12 of the second pull-down circuit 130-4 may be electrically disconnected. Thus, both the first terminal Y and the third terminal F1 are at logic level '1'.

Since the third terminal F1 is at logic level '1', the switch S1 may be electrically disconnected and the switch S2 may be electrically connected. Accordingly, the second terminal F2 is at logic level '1', which is the same as the first terminal Y. Also, since the second terminal F2 is at logic level '1', the switch S3 may be electrically disconnected and the switch S4 may be electrically connected. Accordingly, the fourth terminal X is at logic level '0'.

When a logic value '0' is input to the input terminal A and the logic value '1' is input to the input terminal B, the switches S5 and S9 may be electrically connected and the switches S7 and S12 may be electrically disconnected. Also, since the input terminal B is at logic level '1', the switches S6 and S10 may be electrically disconnected and the switches S8 and S11 may be electrically connected.

Thus, the third terminal F1 is at logic level '1' and the second terminal F2 is at logic level '0'. Since the third terminal F1 is at logic level '1', the switch S1 may be electrically disconnected and the switch S2 may be electrically connected. Thus, the first terminal Y is at logic level '0', which is the same as the second terminal F2. Since the second terminal F2 is at logic level '0', the switch S3 may be electrically connected and the switch S4 may be electrically disconnected. Thus, the fourth terminal X is at the same logic level as the third terminal F1.

When the logic value '1' is input to the input terminal A and a logic value '0' is input to the input terminal B, the switches S5 and S9 may be electrically disconnected and the switches S7 and S12 may be electrically connected. Also, since input terminal B is at logic level '0', the switches S6 and S10 may be electrically connected and the switches S8 and S11 may be electrically disconnected.

Thus, the third terminal F1 is at logic level '1' and the second terminal F2 is at logic level '0'. Since the third terminal F1 is at logic level '1', the switch S1 is electrically disconnected and the switch S2 may be electrically connected. Thus, the first terminal Y is at logic level '0' the same as the second terminal F2. Also, since the second terminal F2 is at logic level '0', the switch S3 may be electrically connected and the switch S4 may be electrically disconnected. Thus, the fourth terminal X is at logic level '1', the same as the third terminal F1.

When the logic value '1' is input to both the input terminals A and B, all the switches S5 and S6 of the first pull-up circuit 130-1 and the switches S9 and S10 of the second pull-up circuit 130-3 may be electrically disconnected and all the switches S7 and S8 of the first pull-down circuit 130-2 and the switches S11 and S12 of the second pull-down circuit 130-4 may be electrically connected. Thus, both the second terminal F2 and the fourth terminal X are at logic level '0'.

Since the second terminal F2 is at logic level '0', the switch S3 may be electrically connected and the switch S4 may be electrically disconnected. Therefore, the third terminal F1 is at logic level '0' the same as the fourth terminal X.

Also, since the third terminal F1 is at logic level '0', the switch S1 may be electrically connected and the switch S2 is electrically disconnected. Thus, the first terminal Y is at logic level '1'.

As described above, logic levels of the first terminal Y and the fourth terminal X may be determined according to logic levels of the second terminal F2 and the third terminal F1.

Figures 15, 16:
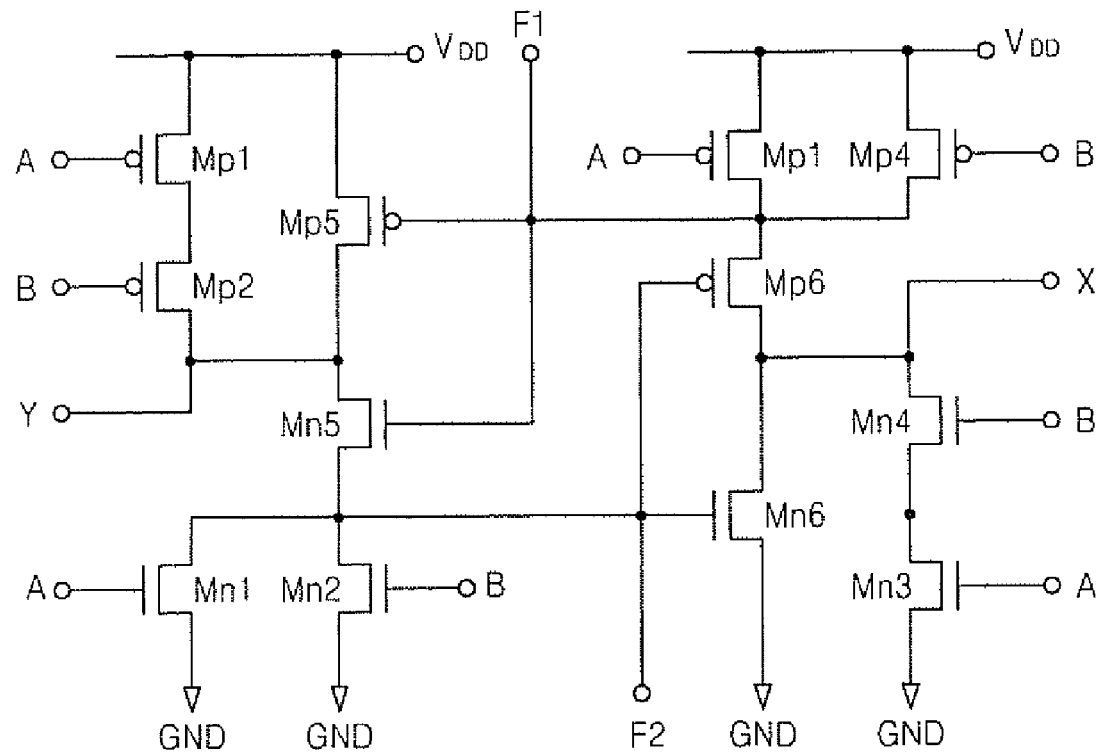
FIG. 15 is a circuit diagram of a MOSFET formed of switches FIG. 14 according to some embodiments of the present invention.
FIG. 16 illustrates a truth table of the multi-functional logic gate device of FIGS. 13 and 15.

A truth table regarding the logic circuit illustrated in FIG. 14 is illustrated in FIG. 16.

Reference is now made to FIG. 16, which is a truth table regarding the logic circuit illustrated in FIG. 14. When values A and B are input, the result of performing an XNOR logic operation is output from the first terminal Y, the result of performing a NAND logic operation is output from the second terminal F2, the result of performing a NOR logic operation is output from the third terminal F1, and the result of performing a XOR logic operation is output from the fourth terminal X.

That is, the logic circuit of FIG. 14 includes the two input terminals A and B, and the four output terminals X, Y, F1, and F2, respectively, generating logic operation outputs that are different from one another. Thus, a user may select and use an output terminal to generate a desired logic operation output from among the four output terminals X, Y, F1 and F2 of the single logic circuit illustrated in FIG. 14.

Some embodiments described herein include methods of reducing the total number of output terminals to be included in the logic circuit of FIG. 14 from four to two. For example, among the four output terminals X, Y, F1, and F2, the fourth terminal X and the first terminal Y may be set as output terminals and the second terminal F2 and the third terminal F1 may be processed as options. As described above, in a logic circuit as illustrated in FIG. 14, the result of performing the XOR logic operation is output from the fourth terminal X and the result of performing the XNOR logic operation is output from the first terminal Y.

If the third terminal F1 is connected to the power source $V_{DD}$, the switch S1 may be electrically disconnected and the switch S2 may be electrically connected, thereby forming a logic circuit in which the first pull-up circuit 130-1 and the first pull-down circuit 130-2 may be electrically connected. Accordingly, the result of performing the NOR logic operation is output from the first terminal Y.

Also, if the second terminal F2 is connected to the ground terminal, the switch S3 may be electrically connected and the switch S4 may be electrically disconnected, thereby forming a logic circuit in which the second pull-up circuit 130-3 and the second pull-down circuit 130-4 may be electrically connected. Thus, the result of performing the NAND logic operation is output from the fourth terminal X.

Figure 17:
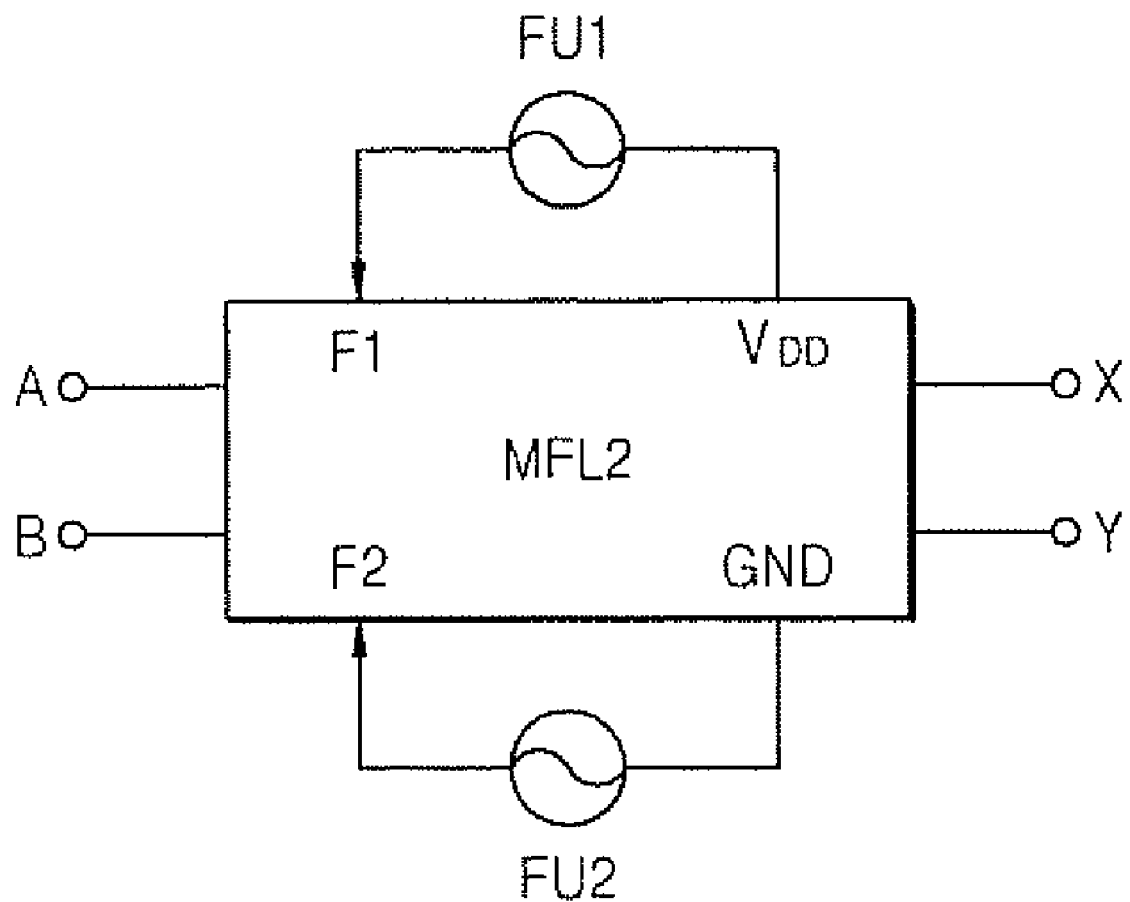
FIG. 17 is a block diagram of a programmable integrated circuit in which a multi-functional logic gate device, such as that shown in FIG. 14, is configured with two input terminals and two output terminals, according to some embodiments of the present invention.

FIG. 17 is a block diagram of a programmable integrated circuit in which a multi-functional logic gate device MLF2, such as that shown in FIG. 14, is configured with two input terminals and two output terminals, according to some embodiments of the present invention.

A fuse FU1 is connected between a third terminal F1 and a power source $V_{DD}$. A fuse FU2 is connected between a second terminal F2 and a ground terminal GND.

As described above with reference to FIG. 14, if the fuses FU1 and FU2 are cut, the result of performing the XOR logic operation is output from the output terminal X and the result of performing the XNOR logic operation is output from the output terminal Y.

If the fuse FU1 is not cut, the result of performing the NOR logic operation is output from the output terminal Y. If the fuse FU2 is not cut, the result of performing the NAND logic operation is output from the output terminal X.

Thus, the result of performing the XOR, XNOR, NOR, or NAND logic operation may be selectively generated via the two output terminals X and Y, depending on whether the fuses FU1 and/or FU2 are cut.

Reference is now made to FIG. 15, which illustrates a logic circuit according to FIG. 14 that includes switches that comprise MOSFETs according to some embodiments of the present invention. In use and operation of the multi-functional logic gate, when a logic value '0' is input to both the input terminals A and B, the PMOS transistors Mp1 and Mp2 of the first pull-up circuit 130-1 and the PMOS transistors Mp3 and Mp4 of the second pull-up circuit 130-3 may be electrically connected. Additionally, the NMOS transistors Mn1 and Mn2 of the first pull-down circuit 130-2 and the NMOS transistors Mn4 and Mn3 of the second pull-down circuit 130-4 may be electrically disconnected. Accordingly, both the first terminal Y and the third terminal F1 are at logic level '1'.

Since the third terminal F1 is at logic level '1', the PMOS transistor Mp5 may be electrically disconnected and the NMOS transistor Mn5 may be electrically connected. In this regard, the second terminal F2 is at logic level '1', which is the same logic level as the first terminal Y. Also, the since the second terminal F2 is at logic level '1', the PMOS transistor Mp6 may be electrically disconnected and the NMOS transistor Mn6 may be electrically connected. Accordingly, the fourth terminal X is at logic level '0'.

When a logic value '0' is input to the input terminal A and the logic value '1' is input to the input terminal B, the PMOS transistors Mp1 and Mp3 may be electrically connected and the NMOS transistors Mn1 and Mn3 may be electrically disconnected. Since the input terminal B is at logic level '1', the PMOS transistors Mp2 and Mp4 may be electrically disconnected and the NMOS transistors Mn2 and Mn4 may be electrically connected.

In this regard, the third terminal F1 is at logic level '1' and the second terminal F2 is at logic level '0'. Since the third terminal F1 is at logic level '1', the PMOS transistor Mp5 may be electrically disconnected and the NMOS transistor Mn5 may be electrically connected. Accordingly, the first terminal Y is at logic level '0', which is the same logic level as the second terminal F2. Also, the second terminal F2 is at logic level '0', and thus, the PMOS transistor Mp6 may be electrically connected and the NMOS transistor Mn6 may be electrically disconnected. Therefore, the fourth terminal X is at logic level '1', which is the same logic level as the third terminal F1.

When the logic value '1' is input to both the input terminal A and the logic value '0' is input to the input terminal B, the PMOS transistors Mp1 and Mp3 may be electrically disconnected and the NMOS transistors Mn1 and Mn3 may be electrically connected. Since the input terminal B is at logic level '0', the PMOS transistors Mp2 and Mp4 may be electrically connected and the NMOS transistors Mn2 and Mn4 may be electrically disconnected.

Thus, the third terminal F1 is at logic level '1' and the second terminal F2 is at logic level '0'. Since the third terminal F1 is at logic level '1', the PMOS transistor Mp5 may be electrically disconnected and the NMOS transistor Mn5 may be electrically connected. Accordingly, the first terminal Y is at logic level '0', which is the same logic level as the second terminal F2. Since the second terminal F2 is at logic level '0', the PMOS transistor Mp6 may be electrically connected and the NMOS transistor Mn6 may be electrically disconnected. Thus, the fourth terminal X is at logic level '1', which is the same logic level as the third terminal F1.

When the logic value '1' is input to both the input terminals A and B, the PMOS transistors Mp1 and Mp2 of the first pull-up circuit 130-1 and the PMOS transistors Mp3 and Mp4 of the second pull-up circuit 130-3 may be electrically disconnected and the NMOS transistors Mn1 and Mn2 of the first pull-down circuit 130-2 and the NMOS transistors Mn4 and Mn3 of the second pull-down circuit 130-4 may be electrically connected. Thus, both the second terminal F2 and the fourth terminal X are at logic level '0'.

Since the second terminal P2 is at logic level '0', the PMOS transistor Mp6 may be electrically connected and the NMOS transistor Mn6 may be electrically disconnected, and thus, the third terminal F1 is at logic level '0', which is the same logic level as the fourth terminal X.

Also, since the third terminal F1 is at logic level '0', the PMOS transistor Mp5 may be electrically connected and the NMOS transistor Mn5 may be electrically disconnected, and thus, the first terminal Y is at logic level '1'.

Accordingly, a truth table regarding the logic circuit illustrated in FIG. 15 is as illustrated in FIG. 16.

Referring to FIG. 15, it may be effective to arrange transistors for input terminals in the order of B and A in the second pull-down circuit 130-4 and in the order of A and B in the first pull-up circuit 130-1 (i.e. opposite order to each other), in order to prevent leakage current from being generated due to a delay in an input signal when logic levels of the input terminals A and B are respectively changed from '0' and '1' to '1' and '0'.

While the inventive concept has been particularly shown and described with reference to exemplary embodiments thereof, it will be understood that various changes in form and details may be made therein without departing from the spirit and scope of the following claims.

What is claimed is:

1. A multi-functional logic gate device comprising:
 a pull-up switching unit having input switches of a first group being respectively connected to a plurality of input terminals and selection switches of the first group connected to either a selection terminal or a logically inverted selection terminal, the pull-up switching unit electrically connecting the input switches of the first group between a power source and an output terminal to have a single serial or parallel structure according to logic levels of the selection terminal and the inverted selection terminal; and
 a pull-down switching unit having input switches of a second group being respectively connected to a plurality of input terminals and selection switches of the second group connected to either the selection terminal or the inverted selection terminal, the pull-down switching unit electrically connecting the input switches of the second group in a parallel connection or in a series connection between the output terminal and a ground terminal according to the logic levels of the selection terminal and the inverted selection terminal, wherein the series connection or the parallel connection of the input switches of the second group is complementarily opposite to the series connection or the parallel connection of the input switches of the first group,
 wherein the multi-functional logic gate is set to operate as a NAND gate or a NOR gate according to logic levels of the selection terminal and the inverted selection terminal.

2. The device of claim 1, wherein the input switches of the first group comprise first transistors and the input switches of the second group comprise second transistors that are complementary to the first transistors.

3. The device of claim 1, wherein the pull-up switching unit comprises:
 a first selection switch and a first input switch connected in series between the power source and the output terminal;
 a second input switch and a second selection switch connected in series between the power source and the output terminal; and
 a third selection switch connecting a first node to a second node, wherein the first selection switch and the first input switch are connected to the first node and the second input switch and the second selection switch are connected to the second node,
 wherein the first and second selection switches are switch-controlled according to the logic level of the selection terminal, the third selection switch is switch-controlled according to the logic level of the inverted selection terminal, and the first and second input switches are respectively switch-controlled according to logic levels of first and second input terminals.

4. The device of claim 1, wherein the pull-down switching unit comprises:
 a fourth selection switch and a third input switch connected in series between the output terminal and the ground terminal;
 a fourth input switch and a fifth selection switch connected in series between the output terminal and the ground terminal; and
 a sixth selection switch connecting a first node to a second node, wherein the fourth selection switch and the third input switch are connected to the first node and the fourth input switch and the fifth selection switch are connected to the second node,
 wherein the fourth and fifth selection switches are switch-controlled according to the logic level of the selection terminal, the sixth selection switch is switch-controlled according to the logic level of the inverted selection terminal, and the third and fourth input switches are respectively switch-controlled according to logic levels of the first and second input terminals.

5. A multi-functional logic gate device comprising:
 a pull-up switching unit having input switches of a first group respectively connected to a plurality of input terminals and selection switches of the first group connected to a selection terminal, the pull-up switching unit electrically connecting the input switches of the first group a series connection or in a parallel connection between a power source and an output terminal according to a logic level of the selection terminal; and
 a pull-down switching unit having input switches of a second group respectively connected to a plurality of input terminals and selection switches of the second group connected to a selection terminal, the pull-down switching unit electrically connecting the input switches of the second group between the output terminal and a ground terminal according to the logic level of the selection terminal, wherein the series connection or the parallel connection of the input switches of the second group is complementarily opposite to the series connection or the parallel connection of the input switches of the first group,
 wherein the multi-functional logic gate is set to operate as a NAND gate or a NOR gate according to logic levels of the selection terminal and the inverted selection terminal.

6. The device of claim 5, wherein the input switches of the first group and the input switches of the second group comprise complementary transistors.

7. The device of claim 5, the pull-up switching unit comprises:
 a first selection switch and a first input switch connected in series between the power source and the output terminal;
 a second input switch and a second selection switch connected in series between the power source and the output terminal; and
 a third selection switch connecting a node to which the first selection switch and the first input switch are connected to a node to which the second input switch and the second selection switch are connected, wherein the first through third selection switches are switch-controlled according to the logic level of the selection terminal and the first and second input switches are respectively switch-controlled according to logic levels of first and second input terminals.

8. The device of claim 5, wherein the pull-down switching unit comprises:

a fourth selection switch and a third input switch connected in series between the output terminal and the ground terminal;

a fourth input switch and a fifth selection switch connected in series between the output terminal and the ground terminal; and a sixth selection switch connecting a node to which the fourth selection switch and the third input switch are connected to a node to which the fourth input switch and the fifth selection switch are connected, wherein the fourth through sixth selection switches are switch-controlled according to the logic level of the selection terminal, and wherein the third and fourth input switches are respectively switch-controlled according to logic levels of the first and second input terminals.

9. A programmable integrated circuit device comprising:

a multi-functional logic gate device comprising a pull-up switching unit having input switches of a first group being respectively connected to a plurality of input terminals and selection switches of the first group being connected to either a selection terminal or a logically inverted selection terminal, the pull-up switching unit electrically connecting the input switches of the first group between a power source and an output terminal to have a single serial or parallel structure according to logic levels of the selection terminal and the inverted selection terminal, and a pull-down switching unit having input switches of a second group being respectively connected to a plurality of input terminals and selection switches of the second group connected to either the selection terminal or the inverted selection terminal, the pull-down switching unit electrically connecting the input switches of the second group in parallel or in series between the output terminal and a ground terminal according to the logic levels of the selection terminal and the inverted selection terminal, wherein the connection of the input switches of the second group is complementarily opposite to the connection of the input switches of the first group; and a plurality of fuses that are operable to determineing the logic level of the selection terminal of the multi-functional logic gate device and that are operable to configure the multi-functional logic gate as a NAND gate or a NOR gate responsive to whether the fuses are cut.

10. A programmable integrated circuit device comprising:

a multi-functional logic gate device comprising a pull-up switching unit having input switches of a first group respectively connected to a plurality of input terminals and selection switches of the first group connected to a selection terminal, the pull-up switching unit electrically connecting the input switches of the first group in series or in parallel between a power source and an output terminal according to a logic level of the selection terminal, and a pull-down switching unit having input switches of a second group respectively connected to a plurality of input terminals and selection switches of the second group connected to a selection terminal, the pull-down switching unit electrically connecting the input switches of the second group between the output terminal and a ground terminal to have a single serial or parallel structure according to the logic level of the selection terminal, wherein the connection of the input switches of the second group is complementarily opposite to the connection of the input switches of the first group; and a plurality of fuses determininging the logic level of the selection terminal of the multi-functional logic gate device, wherein the multi-functional logic gate is set as a NAND gate or a NOR gate depending on whether the fuses are cut.

11. The device of claim 1, wherein the input switches of the first group comprise PMOS transistors and the input switches of the second group comprise NMOS transistors.

12. The device of claim 1, wherein the selection switches of the first group comprise PMOS transistors and the selection switches of the second group comprise NMOS transistors.

13. The device of claim 3, wherein the first and second input switches and the first through third selection switches comprise PMOS transistors.

14. The device of claim 3, wherein the third and fourth input switches and the fourth through sixth selection switches comprise PMOS transistors.

15. The device of claim 6, wherein the input switches of the first group comprise PMOS transistors and the input switches of the second group comprise NMOS transistors.

16. The device of claim 7, wherein the first and second input switches and the first and second selection switches comprise PMOS transistors, and the third selection switch comprises an NMOS transistor.

17. The device of claim 8, wherein the third and fourth input switches and the fourth and fifth selection switches comprise PMOS transistors, and wherein the sixth selection switch comprises an NMOS transistor.

* * * * *